US012322087B1

(12) United States Patent
Conrad et al.

(10) Patent No.: US 12,322,087 B1
(45) Date of Patent: Jun. 3, 2025

(54) MULTI-SCALE AUTOENCODERS FOR SEMICONDUCTOR WORKPIECE UNDERSTANDING

(71) Applicant: Wolfspeed, Inc., Durham, NC (US)

(72) Inventors: Matthew David Conrad, Cary, NC (US); Edward Robert Van Brunt, Cary, NC (US)

(73) Assignee: WOLFSPEED, INC., Durham, NC (US)

( * ) Notice: Subject to any disclaimer, the term of this patent is extended or adjusted under 35 U.S.C. 154(b) by 0 days.

(21) Appl. No.: 18/674,427

(22) Filed: May 24, 2024

(51) Int. Cl.
  *G06T 3/40* (2024.01)
  *G06T 7/00* (2017.01)
  *H01L 21/66* (2006.01)

(52) U.S. Cl.
  CPC ............ *G06T 7/001* (2013.01); *G06T 3/40* (2013.01); *H01L 22/12* (2013.01); *G06T 2207/20016* (2013.01); *G06T 2207/20081* (2013.01); *G06T 2207/20132* (2013.01); *G06T 2207/20224* (2013.01); *G06T 2207/30164* (2013.01)

(58) Field of Classification Search
  CPC . G06T 7/001; G06T 3/40; G06T 2207/20016; G06T 2207/20084; G06T 2207/20081; G06T 2207/20132; G06T 2207/20224; G06T 2207/30148; H01L 22/12; G06N 3/0455; G06F 30/398
  See application file for complete search history.

(56) References Cited

U.S. PATENT DOCUMENTS

| | | | |
|---|---|---|---|
| 10,294,584 B2 | 5/2019 | Gupta et al. | |
| 11,250,595 B2 * | 2/2022 | Covell | ............... G06N 3/08 |
| 11,361,454 B2 | 6/2022 | Leonard et al. | |
| 12,043,918 B2 | 7/2024 | Uematsu | |
| 12,099,026 B2 | 9/2024 | Yokoyama et al. | |
| 2020/0273210 A1 * | 8/2020 | Nguyen | ............. G06F 30/398 |
| 2020/0365685 A1 | 11/2020 | Leonard et al. | |
| 2021/0406679 A1 * | 12/2021 | Wen | ................. G06V 20/56 |

(Continued)

FOREIGN PATENT DOCUMENTS

| | | |
|---|---|---|
| CA | 3226830 A1 | 2/2023 |
| CN | 110983434 | 4/2020 |

(Continued)

OTHER PUBLICATIONS

Kingma et al., "Auto-Encoding Variational Bayes", arXiv:1312.6114v11, Dec. 10, 2022, 14 pages.

(Continued)

*Primary Examiner* — Sumati Lefkowitz
*Assistant Examiner* — Michael Adam Shariff
(74) *Attorney, Agent, or Firm* — Dority & Manning, P.A.

(57) ABSTRACT

An example method includes obtaining a workpiece image of a semiconductor workpiece. The example method includes providing the workpiece image as input to a machine-learned encoding model. The example method includes obtaining an output from the machine-learned encoding model, the output includes an encoding corresponding to the semiconductor workpiece. The example method includes determining one or more characteristics of the semiconductor workpiece based at least in part on the encoding or modifying a semiconductor manufacturing process based at least in part on the encoding.

21 Claims, 10 Drawing Sheets

(56) References Cited

U.S. PATENT DOCUMENTS

| | | | | |
|---|---|---|---|---|
| 2022/0284624 | A1* | 9/2022 | Nimmagadda | G06T 7/75 |
| 2022/0334554 | A1* | 10/2022 | Feng | H01L 22/12 |
| 2023/0206399 | A1* | 6/2023 | Dong | G06T 5/70 |
| | | | | 345/667 |
| 2024/0135630 | A1* | 4/2024 | Nagano | G06T 5/70 |

FOREIGN PATENT DOCUMENTS

| | | | |
|---|---|---|---|
| CN | 111593407 | | 8/2020 |
| CN | 112160028 | | 1/2021 |
| CN | 112553694 | | 3/2021 |
| CN | 112831840 | | 5/2021 |
| CN | 113136622 | | 7/2021 |
| CN | 113445121 | | 9/2021 |
| CN | 214782260 | | 11/2021 |
| JP | 3898278 | | 3/2007 |
| JP | 2023-024330 | A | 2/2023 |
| KR | 20130027967 | A * | 3/2013 |
| WO | WO-2023073281 | A1 * | 5/2023 |

OTHER PUBLICATIONS

Andreoli et al., "Graphite: An Enabler for Single Crystal SiC Growth", Abstract and Poster, ICSCRM 2024: International Conference on Silicon Carbide and Related Materials, Sep. 30, 2024, Raleigh, North Carolina, 3 pages.

Hammer et al., "Crystal Quality Evaluation of 6-inch and 8-inch SiC Growth in Resistive Furnaces: Defect Mapping and Characterization", Abstract, ICSCRM 2024: International Conference on Silicon Carbide and Related Materials, Sep. 30, 2024, Raleigh, North Carolina, 4 pages.

Jeong et al., "Rapid Growth of Bulk SiC Crystals via Physical Vapor Transport Method: Challenges to Improvement in the Crystal Qualities under Rapid Growth", Abstract, ICSCRM 2024: International Conference on Silicon Carbide and Related Materials, Sep. 30, 2024, Raleigh, North Carolina, 4 pages.

Schuck-Buehner et al., "TaC-Based Protective Coating Systems Adapted on Graphite Materials with Different Thermal Expansion for the Use in SiC PVT Crystal Growth", Abstract, ICSCRM 2024: International Conference on Silicon Carbide and Related Materials, Sep. 30, 2024, Raleigh, North Carolina, 4 pages.

Tahara et al., "Study on Effect of Interfacial Pore Between Seed and Graphite Holder for Physical Vapor Transport Growth of 4H-SiC Crystal", Abstract, ICSCRM 2024: International Conference on Silicon Carbide and Related Materials, Sep. 30, 2024, Raleigh, North Carolina, 3 pages.

Taucher et al., "ML-Based Surrogate Model for Temperature Prediction and Efficient Parameter Calibration of PVT Simulations", Abstract, ICSCRM 2024: International Conference on Silicon Carbide and Related Materials, Sep. 30, 2024, Raleigh, North Carolina, 3 pages.

Uematsu et al., "Development of a 200 mm-Diameter 4H-SiC Crystal Using the HTCVD Method Enhanced by Process Informatics", Abstract, ICSCRM 2024: International Conference on Silicon Carbide and Related Materials, Sep. 30, 2024, Raleigh, North Carolina, 3 pages.

Ujihara et al., "8-inch Thick SiC Crystals Grown by Solution Growth Method Combined with Digital Twin", Abstract, ICSCRM 2024: International Conference on Silicon Carbide and Related Materials, Sep. 30, 2024, Raleigh, North Carolina, 5 pages.

Wellmann et al., "Improvement of the Yield During Crystal Growth of SiC by PVT by Proper Selection and Design of Hot Zone Isolation Components", Abstract, ICSCRM 2024: International Conference on Silicon Carbide and Related Materials, Sep. 30, 2024, Raleigh, North Carolina, 4 pages.

Yoshikawa et al., "A Novel Method to Grow 4H-SiC Single Crystals with Low BPD Densities on Multiple Substrates: Grown Crystals' Properties and their Controlling Factors", Abstract, ICSCRM 2024: International Conference on Silicon Carbide and Related Materials, Sep. 30, 2024, Raleigh, North Carolina, 2 pages.

Zhou et al., "Numerical Simulation Study on Different Scales to Suppress Solvent Inclusion Defects in SiC Solution Crystal Growth", Abstract, ICSCRM 2024: International Conference on Silicon Carbide and Related Materials, Sep. 30, 2024, Raleigh, North Carolina, 4 pages.

\* cited by examiner

MULTI-SCALE AUTOENCODERS FOR SEMICONDUCTOR WORKPIECE UNDERSTANDING

FIELD

The present disclosure relates generally to manufacturing semiconductor devices.

BACKGROUND

Semiconductor devices can be fabricated from workpieces of semiconductor material, such as silicon, sapphire, silicon carbide (SiC), and many others. These materials exhibit many attractive electrical and thermophysical properties, making it suitable for the fabrication of workpieces or substrates for high power density solid state devices, such as power electronic, radio frequency, and optoelectronic devices. During manufacturing, these materials may have crystalline material features at multiple length scales, from workpiece-sized features down to micron-scale features or sub-micron scale features (e.g., nanometer scale features). It may be desirable to detect and characterize the features during device manufacturing.

SUMMARY

Aspects and advantages of embodiments of the present disclosure will be set forth in part in the following description, or can be learned from the description, or can be learned through practice of the embodiments.

In an aspect, the present disclosure provides an example method. In some implementations, the example method includes obtaining a workpiece image of a semiconductor workpiece. In some implementations, the example method includes providing the workpiece image as input to a machine-learned encoding model. In some implementations, the example method includes obtaining an output from the machine-learned encoding model, the output comprising an encoding corresponding to the semiconductor workpiece. In some implementations, the example method includes determining one or more characteristics of the semiconductor workpiece based at least in part on the encoding.

In an aspect, the present disclosure provides an example method. In some implementations, the example method includes obtaining a plurality of workpiece images, each workpiece image depicting at least one semiconductor workpiece. In some implementations, the example method includes providing input to an autoencoder having an encoder portion and a decoder portion, the input comprising the plurality of workpiece images, wherein the encoder portion is configured to produce an encoding based on the input and the decoder portion is configured to produce a recreated input based on the encoding. In some implementations, the example method includes training the autoencoder based on a loss between the input and the recreated input.

In an aspect, the present disclosure provides an example method. In some implementations, the example method includes obtaining a workpiece image of a semiconductor workpiece. In some implementations, the example method includes downsampling a workpiece image portion from a first resolution to a second resolution to produce a downsampled image. In some implementations, the example method includes upsampling the downsampled image to produce a first smoothed image. In some implementations, the example method includes subtracting the first smoothed image from the workpiece image portion to produce a first residual image.

In an aspect, the present disclosure provides an example system. In some implementations, the example system includes an imaging device configured to capture a workpiece image of the semiconductor workpiece. In some implementations, the example system includes one or more processors and one or more non-transitory, computer-readable media storing: a machine-learned encoding model; and instructions that, when implemented, cause the one or more processors to perform operations. The operations include obtaining the workpiece image of the semiconductor workpiece from the imaging device; providing the workpiece image as input to the machine-learned encoding model; obtaining an output from the machine-learned encoding model, the output comprising an encoding corresponding to the semiconductor workpiece; and determining one or more characteristics of the semiconductor workpiece based at least in part on the encoding.

In an aspect, the present disclosure provides an example method. In some implementations, the example method includes obtaining a workpiece image of a semiconductor workpiece. In some implementations, the example method includes providing the workpiece image as input to a machine-learned encoding model. In some implementations, the example method includes obtaining an output from the machine-learned encoding model, the output comprising an encoding corresponding to the semiconductor workpiece. In some implementations, the example method includes modifying a manufacturing process based at least in part on the encoding.

Other aspects of the present disclosure are directed to various systems, methods, apparatuses, non-transitory computer-readable media, computer-readable instructions, and computing devices.

These and other features, aspects, and advantages of various embodiments of the present disclosure will become better understood with reference to the following description and appended claims. The accompanying drawings, which are incorporated in and constitute a part of this specification, illustrate example embodiments of the present disclosure and, together with the description, explain the related principles.

BRIEF DESCRIPTION OF THE DRAWINGS

Detailed discussion of embodiments directed to one of ordinary skill in the art is set forth in the specification, which refers to the appended figures, in which.

DETAILED DESCRIPTION

Figure 1:
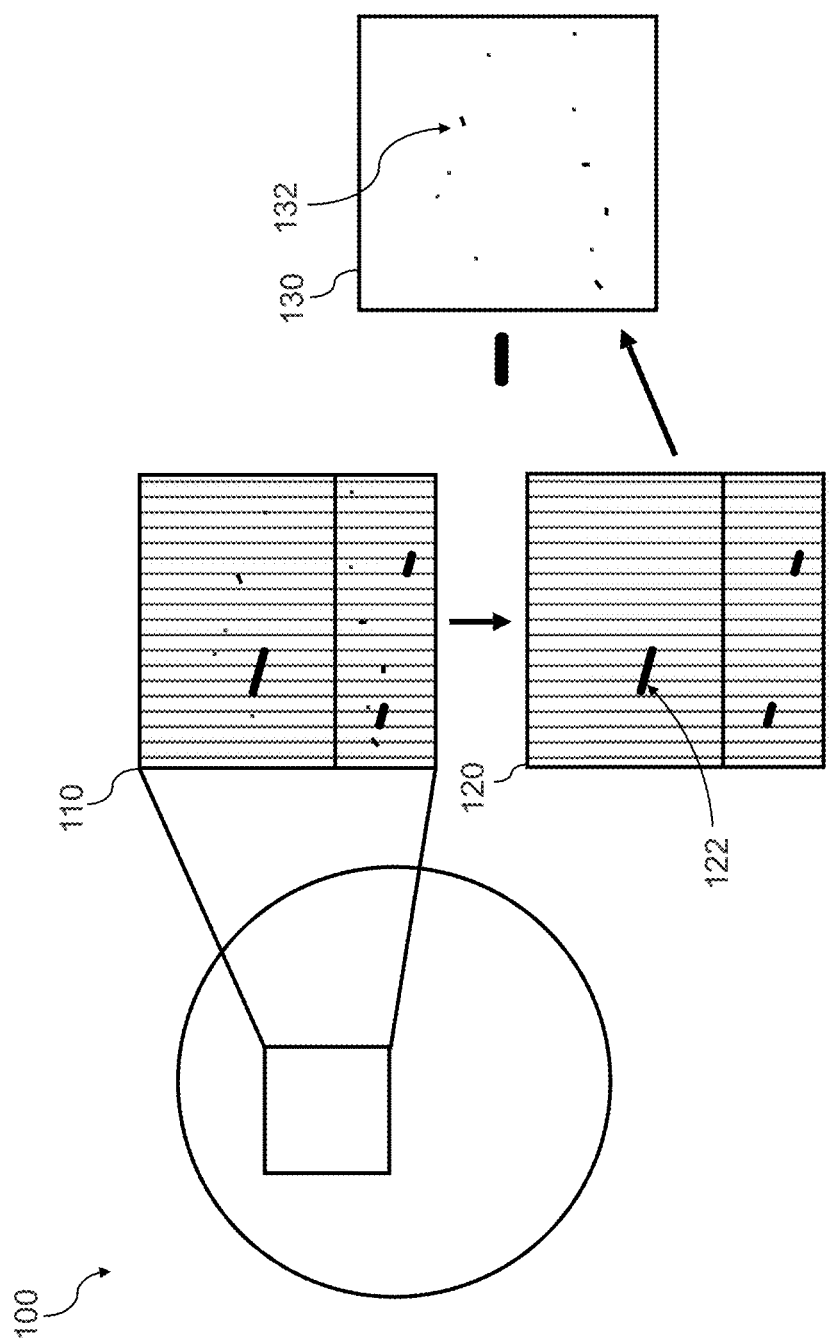
FIG. 1 depicts an example process for producing residual images according to example aspects of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Power semiconductor devices are often fabricated from wide bandgap semiconductor materials, such as silicon carbide or Group III-nitride based semiconductor materials (e.g., gallium nitride). Herein, a wide bandgap semiconductor material refers to a semiconductor material having a bandgap greater than 1.40 eV. Aspects of the present disclosure are discussed with reference to silicon carbide-based semiconductor structures as wide bandgap semiconductor structures. Those of ordinary skill in the art, using the disclosures provided herein, will understand that example embodiments of the present disclosure may be used with any semiconductor material, such as other wide bandgap semiconductor materials, without deviating from the scope of the present disclosure. Example wide bandgap semiconductor materials include silicon carbide and the Group III-nitrides.

Power semiconductor devices may be fabricated using epitaxial layers formed on a semiconductor workpiece, such as a silicon carbide semiconductor wafer. Example semiconductor workpieces may include or be formed of one or more crystalline semiconductor materials, such as silicon, silicon carbide, sapphire, or other suitable materials. The semiconductor workpiece may be subjected to various fabrication processes to form semiconductor devices on the semiconductor workpiece. Examples fabrication process may include, for instance, surface processing operations (e.g., grinding, lapping, polishing), epitaxial growth processes, deposition, etching, annealing, implantation, surface treatment, and/or other processes to form semiconductor devices on the semiconductor workpiece. Example fabrication processes includes both workpiece fabrication processes (e.g., fabricating semiconductor workpieces, such as silicon carbide semiconductor wafers) as well as various stages of semiconductor device fabrication using semiconductor workpieces (e.g., MOSFETs, Schottky diodes, HEMTs, IGBTs, etc.).

Aspects of the present disclosure are discussed with reference to a semiconductor workpiece that is a semiconductor wafer that includes silicon carbide ("silicon carbide semiconductor wafer") for purposes of illustration and discussion. Those of ordinary skill in the art, using the disclosures provided herein, will understand that aspects of the present disclosure can be used with other semiconductor workpieces. Other semiconductor workpieces may include carrier substrates, ingots, boules, polycrystalline substrates, monocrystalline substrates, bulk crystalline material having a thickness of greater than about 1 mm, such as greater than about 5 mm, such as greater than about 10 mm, such as greater than about 20 mm, such as greater than about 50 mm, such as greater than about 100 mm, to 200 mm, etc.

In some examples, the semiconductor workpiece includes silicon carbide crystalline material. The silicon carbide crystalline material may have a 4H crystal structure, 6H crystal structure, or other crystal structure. The semiconductor workpiece can be an on-axis workpiece (e.g., end face parallel to the (0001) plane) or an off-axis workpiece (e.g., end face non-parallel to the (0001) plane), such as a 2°, 4°, 6°, or 8° off-axis workpiece.

Aspects of the present disclosure may make reference to a surface of the silicon carbide semiconductor workpiece. In some examples, the surface of the workpiece may be, for instance, a silicon face of the workpiece. In some examples, the surface of the workpiece may be, for instance, a carbon face of the workpiece.

Crystalline material features can be introduced during the manufacturing process of the semiconductor workpiece, such as silicon carbide semiconductor workpieces. These features can range in width scale from nearly workpiece-size features to micron or sub-micron features (e.g., nanometer scale). Example features may include crystalline material features, such as threading edge dislocations, basal plan dislocations, super screw dislocations, micropipes, mixed dislocations, hexagonal voids, stacking faults, scratches, other polytypes, contamination, and other features. In certain examples, the feature width is less than or equal to about 10 microns. In certain examples, the feature width is less than or equal to about 3 microns. In certain embodiments, the feature width is in a range of about 1 micron and 25 microns. In certain embodiments, the feature width is less than 1 micron, such as in a range of about 1 nanometers to about 900 nanometers. As used herein, a "feature width" refers to a smallest dimension in the positional coordinate plane an image of the workpiece. Because of the significant variety of potential features and the range of potential sizes or lengths of features, it can be challenging to characterize and inspect the features of semiconductor workpieces at scale.

Certain metrology solutions may be able to detect features, such as individual micropipes, basal plane dislocation, scratches, etc., using high resolution semiconductor workpiece imaging (e.g., about 1 to about 10 microns per pixel). However, these types of features may not occur at random, but rather may have specific spatial distributions based on crystal growth and workpiece processing issues or anomalies. Classifying and detecting feature distributions in semiconductor workpieces could provide more accurate information to accelerate crystal growth and workpiece technology process development. Furthermore, as crystal growth and semiconductor workpiece processing technologies evolve, new features and feature distributions may arise that are not adequately detected by prior techniques.

Example aspects of the present disclosure provide improved systems and methods for inspecting and characterization of semiconductor workpieces. In particular, systems and methods according to example aspects of the present disclosure can obtain an image of a semiconductor workpiece. As used herein, an image is any two-dimensional representation of data associated with positional coordinates of a semiconductor workpiece. Data (nondestructive and destructive) that is spatially coordinated (e.g., to an x and y position of a workpiece) may be referred to as an image. In some examples, the images may be, for instance, optical surface microscopy images, photoluminescence (PL) microscopy images, cross-polarized light imaging images, and x-ray topography images, scanning electron microscopy images, or other images.

The images may be, for instance, nondestructive and/or destructive images of the workpiece. As used herein, the terms "nondestructive data" and "nondestructive image" of a workpiece respectively refer to data and an image that have been obtained without destroying, consuming, or otherwise damaging the workpiece. In this regard, nondestructive data and nondestructive images may be obtained for a workpiece on which one or more devices may subsequently be formed. For example, a spatially coordinated PL image of an unetched silicon carbide workpiece may be referred to as a nondestructive image. In contrast, the terms "destructive data" and "destructive image" refer to data or an image of a workpiece that has been destroyed, consumed, or otherwise damaged to the point that subsequent devices may not be formed thereon. For example, any spatially coordinated image of a silicon carbide workpiece that has been etched with KOH/EOH or the like to delineate etch pits may be referred to as a destructive image. Additionally, nondestructive and destructive data and corresponding images may include one or more data signals or data channels. For example, a data signal may comprise a light emission characteristic from a crystalline feature analyzed through a light filter. Data signals may correspond to absorption signals and/or emission signals.

The workpiece image can be captured by a suitable imaging device, such as PL microscope, x-ray topographic imaging source, cross-polarized light imaging source, camera, scanning electron microscope, etc. In some examples, the image may be a composite image of the semiconductor workpiece that has been stitched or aggregated together from multiple images (e.g., multiple different types of images).

As one example, the imaging device may provide workpiece images at a resolution of about 1 micron to about 10 microns per pixel, such as about 3 microns to about 10 microns, such as about 3 microns per pixel to about 7 microns per pixel, such as about 1.7 microns per pixel (e.g., for optical microscopy images) or 3 microns per pixel (e.g., for PL images) or about 7 microns per pixel (for x-ray topography images).

In some examples, for instance, when using scanning electron microscopy-based images, the resolution may be less than 1 micron per pixel, such as in a range of about 0.5 nanometers and about 10 nanometers per pixel or in a range of about 1 nanometer to about 20 nanometers per pixel. Certain examples of the present disclosure may be discussed with micron scale resolution for purposes of illustration and discussion. Those of ordinary skill in the art, using the disclosures provided herein, will understand that the systems and methods may be used with images having nanometer scale resolution, such as scanning electron microscopy images, without deviating from the scope of the present disclosure.

The workpiece image can span an entire surface of the semiconductor workpiece. In some examples, the workpiece image can span a portion of the semiconductor workpiece. In some examples, multiple smaller images depicting portions of the semiconductor workpiece can be stitched or joined together to form the workpiece image.

The workpiece image can be provided as input to a machine-learned encoding model. The machine-learned encoding model can be any suitable encoding or encoder model. An encoding model can receive various types of input (e.g., image data, alphanumerical data, etc.) and, in response to receipt of the input data, produce an encoding as output. The encoding can be a representation of the input variables in a machine-encoded format (e.g., a numerical format). In some examples, the encoding may not be human-readable. However, characteristics and trends among the input data may be represented in characteristics of the encoding.

In particular, the encoding model can be trained to produce encodings that represent characteristics of the input data by training the encoding model end-to-end with a decoding or decoder model. The decoding model can be configured to receive an encoding as input and, in response to receipt of the encoding as input, produce output in a human-intelligible or other suitable format, such as image data, alphanumerical data, classification data, or other suitable data. In some implementations, such an arrangement may be referred to as an "autoencoder." However, in some implementations, the encoding model and decoding model may not necessarily be related or be part of a common model schema such as an autoencoder. For instance, the encoding model and the decoding model may be independent models having separate networks (e.g., neural networks). In some examples, the encoding model may be any suitable machine learned model that is trained to produce encoding that represents input data. The model can have any number of parameters without deviating from the scope of the present disclosure. The model can have various model architectures (e.g., any number convolutional layers, transformer layers, etc.) without deviating from the scope of the present disclosure.

Any suitable autoencoder may be used in accordance with the present disclosure. One example autoencoder that may be used is a variational autoencoder. A variational autoencoder is an artificial neural network architecture including an encoder model (or encoder network) that maps inputs to a lower-dimensional latent space that corresponds to parameters of a variational distribution. The encoding can be sampled from the latent space. The variational autoencoder can additionally include a decoder model (or decoder network) that maps from the latent space to a recreation of the input data used to populate the latent space. The variational autoencoder may include a prior and a noise distribution.

Furthermore, in some implementations, the autoencoder may be a a deep convolutional multiscale variational autoencoder (MS-VAE). The deep convolutional MS-VAE may be an autoencoder that is convolutional, e.g., that includes one or more convolutional neural networks. A convolutional neural network is a type of feed-forward neural network that applies multi-dimensional filters (or "kernels") at inputs and/or links, weighing multiple prior nodes when advancing through layers. Additionally or alternatively, the MS-VAE can receive (and/or produce) inputs at multiple scales or resolution. For instance, the MS-VAE may receive some higher-resolution inputs (e.g, a higher-resolution residual image) and some lower-resolution inputs (e.g., a downsampled workpiece image) that are concurrently processed by the model. These inputs may be input to the model and/or generated by the model itself. For instance, the model may include one or more filters or downsampling operations to produce lower-resolution inputs from higher-resolution inputs. Alternatively, these inputs may be computed separately and provided to the model. As used herein, "providing" inputs to a machine-learned model is intended to cover these and other equivalent variations. It should be understood that the versatility of computing technology may provide for such variations to be within the scope of the present disclosure.

According to example aspects of the present disclosure, residual images at multiple length scales can be generated from a higher-resolution workpiece image of a semiconductor workpiece. These images may be provided to the encoding model (e.g., the variational autoencoder) such that the encoding model may recognize higher-resolution irregularities and features in a surface of the semiconductor workpiece. The residual images can be formed from the workpiece image (e.g., a high-resolution workpiece image), such as from crops or portions of the workpiece image.

One example method for producing residual images includes obtaining a workpiece image portion from the workpiece image. The workpiece image portion can be, for example, a crop or subset of the workpiece image. The workpiece image portion (or crop of the workpiece image) may be cropped or divided along one or more crop coordinates. The crop coordinates can describe the workpiece image portion relative to the entire workpiece image. For instance, the crop coordinates may include coordinates such as dimensional (e.g., X, Y) coordinates, an origin and size (e.g., length and width), or other suitable indicia of crop location. In some implementations, the crop coordinates may be provided as input to the machine-learned encoding model.

The method can include downsampling the workpiece image portion to produce a downsampled image. The workpiece image and its portion may have a first resolution (e.g., a higher resolution) and the downsampled image can have a second resolution (e.g., a lower resolution). Any suitable resolution, which may be dependent in part on contemporary capabilities of imaging devices, may be used in accordance with the present disclosure. As one example, the first resolution may be a resolution having about 1 micron per pixel to about 10 microns per pixel. Additionally or alternatively, the second resolution can be some partial multiple of the first resolution, such as 0.95× the first resolution (e.g., a 5% downsample factor), or such as 0.9× the first resolution (e.g., a 10% downsample factor), or such as 0.8× the first resolution (e.g., a 20% downsample factor), or such as 0.5× the first resolution (e.g., a 50% downsample factor), or a fixed resolution, such as approximately about 5 microns per pixel to about 50 microns per pixel. The downsampling can be performed by any suitable downsampling algorithm or other approach. As one example, a filter can be applied to the higher-resolution workpiece image portion to condense its contents into a lower-resolution downsampled portion. As another example, an average pooling approach, decimation approach, mipmapping approach, box sampling approach, or other suitable downsampling approach can be used such as image resizing operations, max/min/median pooling, gaussian pyramids, custom downsampling pyramid-based methods or other approaches. The workpiece image portion and the first downsampled image may generally depict a common region of the semiconductor workpiece at different resolutions.

The method can include upsampling the downsampled image to produce a first smoothed image at the first resolution. For instance, the downsampled image can be upsampled to the first resolution (or other higher resolution) to produce the first smoothed image. The first smoothed image can generally depict the same region of the semiconductor workpiece as the first downsampled image and the workpiece image portion. However, the subsequent downsampling and upsampling of the smoothed image can erase or smooth higher-resolution details, such as details that are higher resolution than the second resolution, out of the smoothed image. Any suitable upsampling algorithm or other approach can be used in accordance with the present disclosure, such as, for example, various interpolation approaches (nearest neighbor, bilinear, bicubic, etc.), an artificial-intelligence-based approach (e.g., a machine-learned upsampling model), or other suitable upsampling approach, such as standard image resizing, custom image pyramid based upsampling methods or other approaches. In some examples, a decoder model trained according to aspects of the present disclosure using residual images (e.g., from lower levels) may be used to generate upsampled images.

The method can include subtracting the first smoothed image from the workpiece image portion to produce a first residual image. Any suitable approach to image subtraction can be employed in accordance with the present disclosure. For instance, if both the workpiece image portion and the first smoothed image are at the first resolution, the image subtraction may be performed as a pixel-by-pixel subtraction. The subtraction intuitively subtracts out the "average" or relatively lower-resolution features of the workpiece at the workpiece image portion, and the resulting residual image can therefore highlight higher-resolution features at the workpiece image portion. This can include higher-resolution (e.g., relatively smaller) features at a feature scale loosely bounded by the first resolution and the second resolution. The first residual image can be provided as input to the machine-learned encoding model (e.g., along with the workpiece image). Generally, the first residual image captures features at a "feature scale" approximately bounded by the first resolution and the second resolution.

This approach can be repeated multiple times to produce residual images across a plurality of feature scales. For instance, this process can be repeated multiple times to improve representation of multiple length scales having potential features in the workpiece image. For example, the method can further include obtaining a residual portion of the first residual image and downsampling the residual portion of the first residual image to produce a downsampled residual portion. Similar to the first downsampled image, the downsampled residual portion may be downsampled by any suitable downsampling approach. The downsampled residual portion may be downsampled to the second resolution (e.g., to capture the same length scale as the first residual image, which may provide for "focusing" the encoding model on a particular region) or to a third resolution that is different from the second resolution (e.g., to capture a different length scale from the first residual image). Furthermore, the residual portion of the first residual image may be a crop of the first residual image defined by crop coordinates, which may further be provided as input to the machine-learned encoding model, in some implementations.

The method can further include upsampling the downsampled residual portion to produce a second smoothed image. The downsampled residual portion can be upsampled by any suitable upsampling approach. The method can further include subtracting the second smoothed image from the residual portion of the first residual image to produce a second residual image. The subtraction intuitively subtracts out the "average" or relatively lower-resolution features of the workpiece at the residual portion of the first residual image, and the resulting second residual image can therefore highlight higher-resolution features at the portion of the workpiece. The second residual image can correspond to a smaller portion of the semiconductor workpiece (and may be a smaller image size) than the first residual image. The second residual image can be provided as input to the machine-learned encoding model. Aspects of the present disclosure can be extended to generating a third residual image that corresponds to a smaller portion of the semiconductor workpiece (and in some examples may be a smaller image size) than the second residual image. In some examples, aspects of the present disclosure may be extended to generating a fourth residual image that corresponds to a smaller portion of the semiconductor workpiece (and in some examples may be a smaller image size) than the third residual image, and so forth. The methods of generating residual images described herein can be extended to any number of levels without deviating from the scope of the present disclosure. The "level" of a residual image refers to the number of iterations of the example methods described herein used to generate the residual image.

As used herein, reference to higher-resolution and lower-resolution features is intended to invoke a relative comparison of those features to each other and is not intended to limit the features to within any particular range of resolutions. It should be understood that features referred to as lower-resolution features herein may still have a relatively high resolution compared to external metrics (e.g., consumer imaging devices) and are solely intended to be lower resolution than the higher-resolution features they are described in comparison to, unless otherwise indicated.

In some implementations, a downsampled (e.g., lower-resolution) workpiece image can be provided as input to the machine-learned encoding model in addition to or in lieu of the full-resolution workpiece image and the residual image (s). For instance, the method can include downsampling the workpiece image to produce a downsampled workpiece image having a lower resolution than the workpiece image and providing the downsampled workpiece image to the machine-learned encoding model. The downsampled workpiece image can be provided such that the model can reason about the surface of the semiconductor workpiece, but does not necessarily need to reason about the entire surface of the semiconductor workpiece at a high resolution. Rather, according to example aspects of the present disclosure, the higher-resolution details of the semiconductor workpiece can be provided to the encoding model as residual images across one or more feature scales.

Furthermore, in some implementations, additional inputs can be provided to the machine-learned encoding model. As one example, in some implementations, workpiece characterization data of the semiconductor workpiece can be provided as input to the machine-learned encoding model. The workpiece characterization data of the semiconductor workpiece can describe characteristics of the semiconductor workpiece, such as material type, polytype, doping, surface roughness, thickness, and/or other characteristics.

In some implementations, the machine-learned encoding model can include one or more batch normalization layers configured to provide at least one of a zero mean or unity variance for at least one input to the machine-learned encoding model. Additionally or alternatively, some or all of the residual image generation operations described above can be incorporated into the machine-learned encoding model (e.g., as layers of a neural network, or a separate neural network operating in parallel). These portions may be trained end-to-end with the machine-learned encoding model and/or machine-learned encoding model. In some implementations, this approach can benefit from the batch normalizations, since the approach may not normalize the input data explicitly.

The method can include obtaining an output from the machine-learned encoding model. The output can be obtained in response to the model receiving input including, for example, the workpiece image (e.g., a downsampled workpiece image), the first residual image, additional residual images, crop coordinates, and/or additional inputs. The output can be or can include an encoding corresponding to (e.g., unique to) the semiconductor workpiece. For instance, the encoding can be a lower-dimensional representation of the input data. In some implementations, the encoding may be sampled from a distribution produced by a variational autoencoder. Furthermore, in some implementations, the encoding may be an average of multiple samples from the distribution produced by a variational autoencoder.

In some examples, the machine-learned encoding model may include a plurality of machine-learned encoding models, such as a machine-learned encoding model associated with each of a plurality of different resolutions and/or levels of residual images of the semiconductor workpiece. Each machine-learned encoding model may provide an encoding associated with distinct features at the resolution or level of residual image. This may enhance the capability of the machine-learned encoding model to learn distinct features at each resolution or level of residual image.

The method can include determining one or more characteristics of the semiconductor workpiece based at least in part on the encoding. As one example, the one or more characteristics of the semiconductor workpiece can be or can include a quality characteristic of the semiconductor workpiece. For instance, the quality characteristic can generally indicate a quality score of the semiconductor workpiece or may indicate whether the semiconductor workpiece is suitable for future processing steps.

As another example, the one or more characteristics of the semiconductor workpiece can include a similarity characteristic of the semiconductor workpiece to one or more additional semiconductor workpieces. For instance, the encoding can be compared to encodings from other semiconductor workpieces having known characteristics to determine if those characteristics are present in the semiconductor workpiece. As an example, determining the one or more characteristics of the semiconductor workpiece based at least in part on the encoding can include identifying one or more closest encodings corresponding to the one or more additional semiconductor workpieces to the encoding corresponding to the semiconductor workpiece and determining the similarity characteristic based at least in part on the one or more closest encodings. For instance, if the one or more closest encodings are within a degree of similarity of the encoding, the workpiece can have a similarity characteristic.

As another example, the one or more characteristics of the semiconductor workpiece can include one or more anomaly characteristics. For instance, determining the one or more characteristics of the semiconductor workpiece based at least in part on the encoding can include detecting an anomaly characteristic of the encoding corresponding to the semiconductor workpiece using an anomaly detection algorithm. The anomaly detection algorithm may determine whether the encoding is sufficiently different from other encodings to denote that the semiconductor workpiece is exhibiting some anomaly characteristic.

In some examples, the one or more characteristics may include classification of one or more features on the semiconductor workpiece. For instance, the encoding may be used to determine that the workpiece has one or more features, such as threading edge dislocations, basal plane dislocations, super screw dislocations, micropipes, mixed dislocations, hexagonal voids, stacking faults, scratches, other polytypes, contamination, and/or other features. For instance, certain encodings may indicate the presence of one or more micropipes. Certain encodings may indicate the presence of one or more screw dislocations. Certain encodings may indicate the present of one or more basal plane dislocations, and so forth.

In some examples, the one or more characteristics may include identification of data indicative of a distribution of features on the workpiece. For instance, the encoding may be used to determine the presence of a certain distribution of features on the workpiece, such as a distribution of one or more threading edge dislocations, basal plane dislocations, super screw dislocations, micropipes, mixed dislocations, hexagonal voids, stacking faults, scratches, other polytypes, contamination, and/or other features.

The characteristics of the workpiece determined based on the encodings can be used for a variety of purposes, such as automated detection of anomalies and or similarities in a production line for semiconductor workpieces. The encodings may be used, for instance, for quality control, to determine when to keep and/or discard certain workpieces. The encodings may be used, for instance, to identify certain workpieces for different manufacturing steps (e.g., to address certain feature distributions associated with the encodings. In addition, the encodings may be used to identify errors or other anomalies in prior manufacturing steps (e.g., crystal growth, wafer separation of boules, surface processing (e.g., grinding, lapping, polishing)) so that modifications can be made to the previous manufacturing steps to reduce future anomalies on workpieces.

To provide for outputting encodings that reflect the characteristics of the semiconductor workpieces, the method can include training the machine-learned encoding model on a batch of training data. The training data can include input data corresponding to one or more additional semiconductor workpieces. The training data can include, for example, workpiece images (e.g., downsampled workpiece images), residual images, crop coordinates, and/or additional inputs for the additional semiconductor workpieces. In some implementations, the machine-learned encoding model can be trained end-to-end with a machine-learned decoding model. For instance, the machine-learned decoding model can be a decoding network having a separate neural network from the machine-learned encoding model. Additionally or alternatively, the encoding model can be an encoder portion of an autoencoder (e.g., a MS-VAE) trained end-to-end with a decoder portion of the autoencoder such that the autoencoder can encode and decode at least workpiece images (e.g., and/or other inputs).

For instance, one example method for training a machine-learned encoding model can include obtaining a plurality of workpiece images, each workpiece image depicting at least one semiconductor workpiece. The plurality of workpiece images may be obtained from a training dataset. Additionally or alternatively, the workpiece images may be captured by an imaging device.

The method can include providing input to an autoencoder having an encoder portion and a decoder portion. The input can include the plurality of workpiece images, downsampled workpiece images corresponding to the plurality of workpiece images (e.g., in lieu of the plurality of workpiece images themselves), residual images from the plurality of workpiece images produced as described above, crop coordinates, and/or additional inputs corresponding to the plurality of workpiece images. The encoder portion can be configured to produce an encoding based on the input and the decoder portion can be configured to produce a recreated input based on the encoding. The recreated input can approximate the input to the best capability of the autoencoder, which generally improves as the autoencoder is trained on additional data.

In particular, the method can include training the autoencoder based on a loss between the input and the recreated input. The loss may be quantified by a loss function. Loss functions may be used individually or in any combination. For example, an L1 loss, L2 loss, conditional generative adversarial network loss (CGAN loss), VGG loss, and/or an adversarial loss may be used in combination to evaluate the model's prediction. The evaluation may also be completed with any of the loss functions individually. In some implementations, a KL divergence loss function can aid in evaluating the training. For example, a KL divergence loss function may have a second term trend to zero. The trending towards zero may indicate an improvement in the system, and that the system is becoming closer to being optimized. The loss can define a difference between the input and recreated input, which is provided to the autoencoder. The autoencoder can adjust some or all parameters of the encoder portion and/or the decoder portion based on the loss (e.g., based on a gradient of the loss). Other suitable loss functions can be employed in accordance with example aspects of the present disclosure.

Example aspects of the present disclosure can provide a number of technical effects and benefits, including improvements to computing technology and/or semiconductor fabrication technology. For instance, the use of multi-resolution residual images with an autoencoder (e.g., an MS-VAE) can satisfy the rapid manufacutring capacity expansion needed to meet the demand for several industries consuming semiconductor devices, such as the automotive industry, artificial intelligence industries, electronics industries, and so on. The systems and methods according to the present disclosure can replace several manual inspection steps through the workpiece and semiconductor processing routes. Although there are many scalability challenges for manual inspection processes such as training, quality control, floor space and proper feedback metrics for process development, they have endured as conventional systems have lacked comparable ability to detect strange and anomalous features. Example aspects of the present disclosure, however, can provide similarity comparisons and anomaly detection with comparable performance to manual inspection. Furthermore, the use of residual images at one or more feature scales can reduce computational resource usage associated with processing the "raw" workpiece images through encoding and decoding models, as the workpiece images may typically be extremely high-resolution and span an entire surface of the workpiece, which can require substantial computing resources to encode and decode. However, according to some implementations of the present dislcosure, a workpiece image can be provided as input along with one or more residual images, which can avoid the resource-intensive processing of higher-resolution workpiece images. In addition, the resulting residual image may have an image size such that correlated portions that inform the presence of a feature, such as a higher-resolution feature, are close in a pixel space associated with the residual image, reducing computational complexity of models required to identify, localize, classify, and/or encode the presence of the feature from the residual image.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, structure, region, or substrate is referred to as being "on" or extending "onto" another element, it may be directly on or extend directly onto the other element or intervening elements may also be present and may be only partially on the other element. In contrast, when an element is referred to as being "directly on" or extending "directly onto" another element, there are no intervening elements present, and may be partially directly on the other element. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

As used herein, a first structure "at least partially overlaps" or is "overlapping" a second structure if an axis that is perpendicular to a major surface of the first structure passes through both the first structure and the second structure. A "peripheral portion" of a structure includes regions of a structure that are closer to a perimeter of a surface of the structure relative to a geometric center of the surface of the structure. A "center portion" of the structure includes regions of the structure that are closer to a geometric center of the surface of the structure relative to a perimeter of the surface. "Generally perpendicular" means within 15 degrees of perpendicular. "Generally parallel" means within 15 degrees of parallel.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the disclosure are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Similarly, it will be understood that variations in the dimensions are to be expected based on standard deviations in manufacturing procedures. As used herein, "approximately" or "about" includes values within 10% of the nominal value.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

Some embodiments of the invention are described with reference to semiconductor layers and/or regions which are characterized as having a conductivity type such as n type or p type, which refers to the majority carrier concentration in the layer and/or region. Thus, n type material has a majority equilibrium concentration of negatively charged electrons, while p type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

In the drawings and specification, there have been disclosed typical embodiments and, although specific terms are employed, they are used in a generic and descriptive sense only and not for purposes of limitation of the scope set forth in the following claims.

Aspects of the present disclosure are discussed with reference to input data that includes images of semiconductor workpieces. Those of ordinary skill in the art, using the disclosures provided herein, will understand that aspects of the present disclosure may be applicable to other types of data, such as other types of images, without deviating from the scope of the present disclosure.

With reference now to the Figures, example embodiments of the present disclosure will be discussed in further detail.

FIG. 1 depicts a flow diagram of an example process for producing residual images according to example aspects of the present disclosure. According to example aspects of the present disclosure, residual images 130 can be generated from a higher-resolution workpiece image 100 of a semiconductor workpiece. The process can include obtaining a workpiece image portion 110 from the workpiece image

100. The workpiece image portion 110 can be, for example, a crop or subset of the workpiece image 100. The workpiece image portion 110 may be cropped or divided along one or more crop coordinates. The crop coordinates can describe the workpiece image portion 110 relative to the entire workpiece image 100. For instance, the crop coordinates may include coordinates such as dimensional (e.g., X, Y) coordinates, an origin and size (e.g., length and width), or other suitable indicia of crop location. The workpiece image portion 110 can be at a first resolution, which may be detailed enough to capture both higher-resolution features 132 and lower-resolution features 122. In some examples, lower resolution features 122 may have a larger feature width, such as a feature width of greater than about 10 microns, such as greater than about 100 microns. Higher-resolution features may have a smaller feature size and may have a feature width, in some examples, of less than about 10 microns, such as less than about 7 microns.

The method can include downsampling the workpiece image portion 110 to produce a downsampled image (not illustrated). The workpiece image 100 and its portion 110 may be at the first resolution (e.g., a higher resolution) and the downsampled image can have a second resolution (e.g., a lower resolution). Any suitable resolution may be used in accordance with the present disclosure. As one example, the first resolution may be a resolution having about 1 to about 10 microns per pixel. Additionally or alternatively, the second resolution can be some partial multiple of the first resolution, such as 0.95× the first resolution (e.g., a 5% downsample factor), or such as 0.9× the first resolution (e.g., a 10% downsample factor), or such as 0.8× the first resolution (e.g., a 20% downsample factor), or such as 0.5× the first resolution (e.g., a 50% downsample factor), or a fixed resolution, such as approximately five to fifty microns per pixel. The downsampling can be performed by any suitable downsampling algorithm or other approach. As one example, a filter can be applied to the higher-resolution workpiece image portion 110 to condense its contents into a lower-resolution downsampled portion. As another example, an average pooling approach, decimation approach, mipmapping approach, box sampling approach, or other suitable downsampling approach can be used, such as image resizing operations, max/min/median pooling, gaussian pyramids, custom downsampling pyramid-based methods or other approaches. The workpiece image portion 110 and the first downsampled image may generally depict a common region of the semiconductor workpiece at different resolutions.

The method can include upsampling the downsampled image to produce a first smoothed image 120 at the first resolution. For instance, the downsampled image can be upsampled to the first resolution to produce the first smoothed image 120. The first smoothed image 120 can generally depict the same region of the semiconductor workpiece as the first downsampled image and the workpiece image portion 110. However, the subsequent downsampling and upsampling of the smoothed image 120 can erase or smooth higher-resolution features 132, such as details that are higher resolution than the second resolution, out of the smoothed image 120. However, lower-resolution details 122, such as details that are lower resolution than the second resolution, may remain in the first smoothed image 120. This can include, for example, larger features, architectural features of the workpiece, or other lower-resolution features. Any suitable upsampling algorithm or other approach can be used in accordance with the present disclosure, such as, for example, various interpolation approaches (nearest neighbor, bilinear, bicubic, etc.), an artificial-intelligence-based approach (e.g., a machine-learned upsampling model), or other suitable upsampling approach such as standard image resizing, custom image pyramid based upsampling methods or other approaches. In some examples, a decoder model trained according to aspects of the present disclosure using residual images (e.g., from lower levels) may be used to generate upsampled images.

The method can include subtracting the first smoothed image 120 from the workpiece image portion 110 to produce a first residual image 130. Any suitable approach to image subtraction can be employed in accordance with the present disclosure. For instance, if both the workpiece image portion 110 and the first smoothed image 120 are at the first resolution, the image subtraction may be performed as a pixel-by-pixel subtraction. The subtraction intuitively subtracts out the "average" or relatively lower-resolution features 122 of the workpiece at the workpiece image portion 110, and the resulting residual image 130 can therefore highlight higher-resolution features 132 at the workpiece image portion 110. This can include higher-resolution (e.g., relatively smaller) features. In some examples, the first residual image 130 captures features at a "feature scale" approximately bounded by the first resolution and the second resolution. In some examples, the resulting residual image 130 may have an image size such that correlated portions that inform the presence of a feature, such as a higher-resolution feature 132, are close in a pixel space associated with the residual image 130.

Figure 2:
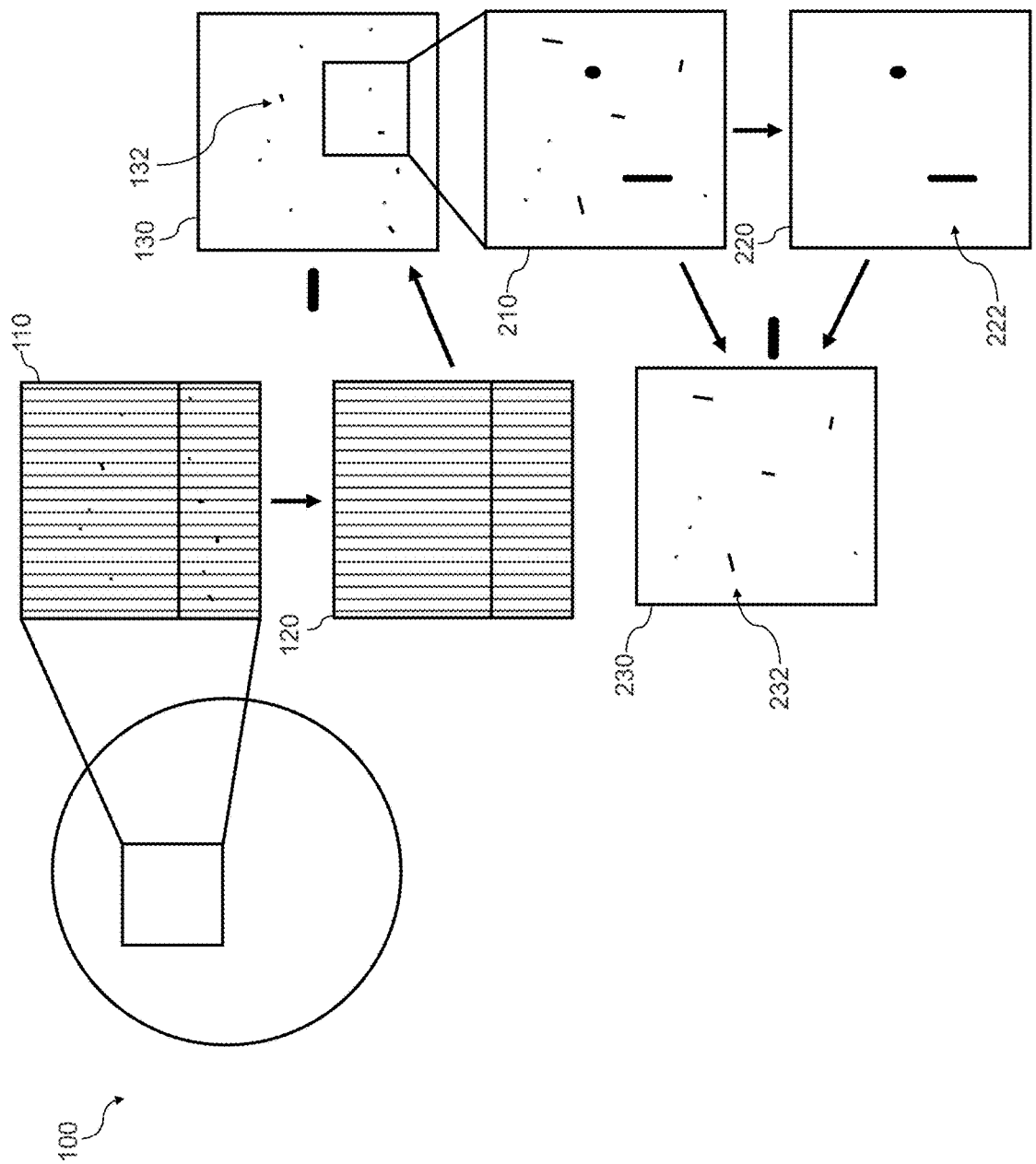
FIG. 2 depicts an example process for producing residual images according to example aspects of the present disclosure.

FIG. 2 depicts a flow diagram of an example process for producing residual images according to example aspects of the present disclosure. FIG. 2 can include components discussed with reference to FIG. 1, such as workpiece image 100, workpiece image portion 110, first smoothed image 120, and first residual image 130. Unless otherwise indicated, like reference numbers are intended to represent similar or identical components, and relevant description with respect to FIG. 1 is intended to equally apply to FIG. 2 except where distinguished.

A first residual image 130 including features 132 at a first feature scale can be produced as described in FIG. 1. For the purposes of illustration, the lower-resolution features 122 of FIG. 1 are omitted from the illustration of FIG. 2. However, they may still be included in the first smoothed image 120 and the first residual image without departing from the aspects of the present disclosure.

The approach described in FIG. 1 can be repeated multiple times to produce residual images across a plurality of feature scales. For instance, this process can be repeated multiple times to improve representation of multiple length scales having potential features in the workpiece image 100. For example, the process can further include obtaining a residual portion 210 of the first residual image 130. The residual portion 210 can be, for example, a crop or a subset of the first residual image 130. The residual portion 210 may be cropped or divided along one or more crop coordinates. The crop coordinates can describe the residual portion 210 relative to the entire first residual image 130. For instance, the crop coordinates may include coordinates such as dimensional (e.g., X, Y) coordinates, an origin and size (e.g., length and width), or other suitable indicia of crop location. The residual portion 210 can be at a first resolution, which may be detailed enough to capture both higher-resolution features 232 and lower-resolution features 222.

The method can include downsampling the residual portion 210 to produce a downsampled residual portion (not illustrated). The first residual image 130 and its portion 210 may be at the first resolution (e.g., a higher resolution). The downsampled residual portion may be downsampled to the second resolution (e.g., to capture the same length scale as the first residual image 130, which may provide for "focusing" the encoding model on a particular region) or to a third resolution that is different from the second resolution (e.g., to capture a different length scale from the first residual image 130). Any suitable resolution, which may be dependent in part on contemporary capabilities of imaging devices, may be used in accordance with the present disclosure. As one example, the first resolution may be a resolution having about 1 micron per pixel to about 10 microns per pixel. Additionally or alternatively, the second resolution or the third resolution can be some partial multiple of the first resolution, such as 0.95× the first resolution (e.g., a 5% downsample factor), or such as 0.9× the first resolution (e.g., a 10% downsample factor), or such as 0.8× the first resolution (e.g., a 20% downsample factor), or such as 0.5× the first resolution (e.g., a 50% downsample factor), or a fixed resolution, such as approximately 5 microns per pixel to about 50 microns per pixel. The downsampling can be performed by any suitable downsampling algorithm or other approach. As one example, a filter can be applied to the higher-resolution residual portion 210 to condense its contents into a lower-resolution downsampled portion. As another example, an average pooling approach, decimation approach, mipmapping approach, box sampling approach, or other suitable downsampling approach can be used, such as image resizing operations, max/min/median pooling, gaussian pyramids, custom downsampling pyramid-based methods or other approaches. The residual portion 210 and the first downsampled residual portion may generally depict a common region of the semiconductor workpiece at different resolutions.

The method can include upsampling the downsampled residual portion to produce a second smoothed image 220 at the first resolution. For instance, the downsampled residual portion can be upsampled to the first resolution to produce the second smoothed image 220. The second smoothed image 220 can generally depict the same region of the semiconductor workpiece as the first downsampled residual portion and the residual portion 210. However, the subsequent downsampling and upsampling of the second smoothed image 220 can erase or smooth higher-resolution details 232, such as details that are higher resolution than the second resolution or third resolution, out of the smoothed image 220. However, lower-resolution details 222, such as details that are lower resolution than the second resolution or third resolution, may remain in the second smoothed image 220. This can include, for example, larger features, architectural features of the workpiece, or other lower-resolution features. Any suitable upsampling algorithm or other approach can be used in accordance with the present disclosure, such as, for example, various interpolation approaches (nearest neighbor, bilinear, bicubic, etc.), an artificial-intelligence-based approach (e.g., a machine-learned upsampling model), or other suitable upsampling approach such as standard image resizing, custom image pyramid based upsampling methods or other approaches.

The method can include subtracting the second smoothed image 220 from the residual portion 210 to produce a second residual image 230. Any suitable approach to image subtraction can be employed in accordance with the present disclosure. For instance, if both the residual portion 210 and the second smoothed image 220 are at the first resolution, the image subtraction may be performed as a pixel-by-pixel subtraction. The subtraction intuitively subtracts out the "average" or relatively lower-resolution features 222 of the workpiece at the residual portion 210, and the resulting residual image 230 can therefore highlight higher-resolution features 232 at the residual portion 210. This can include higher-resolution (e.g., relatively smaller) features at a feature scale loosely bounded by the first resolution and the second resolution. Generally, the second residual image 230 captures features at a "feature scale" approximately bounded by the first resolution and the second resolution or the second resolution and the third resolution, if the third resolution is used.

Figure 3A:
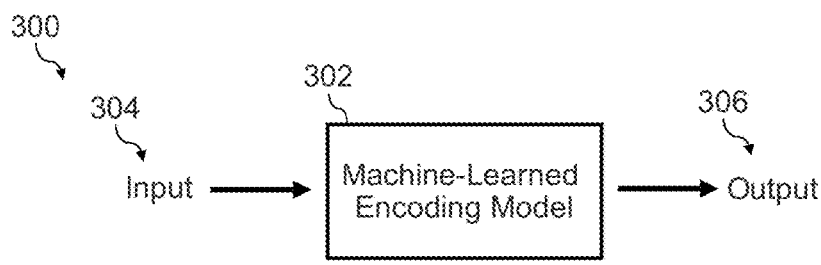
FIGS. 3A-3D depict example machine-learned models according to example aspects of the present disclosure.

FIG. 3A-3D depict example machine-learned models according to example aspects of the present disclosure. In particular, FIG. 3A depicts a machine-learned encoding system 300 according to example aspects of the present disclosure. The machine-learned encoding system 300 can include a machine-learned encoding model 302. The model 302 can be configured to receive input 304 and, in response to receipt of input 304, produce an output 306. According to example aspects of the present disclosure, the input 304 can include workpiece images (and/or downsampled workpiece images), residual images, crop coordinates, data indicative of workpiece characteristics, and/or other inputs as described herein. The output 306 can include an encoding of the input 304. The model 302 can be trained to produce encodings reflective of characteristics of semiconductor workpieces, as described further herein.

Figure 3B:
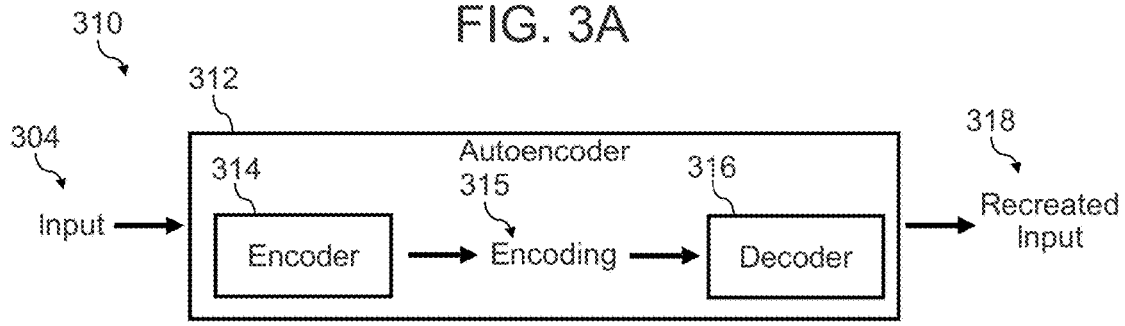

FIG. 3B depicts a machine-learned system 310 according to example aspects of the present disclosure. In particular, the system 310 includes an autoencoder 312 having an encoder portion 314 and a decoder portion 316. Each of the encoder portion 314 and the decoder portion 316 can include a separate network (e.g., neural network) or a separate portion of a network (e.g., a neural network). The autoencoder 312 can be configured to receive input 304. The encoder portion 314 can produce an encoding 315 in response to the input 304. The encoding 315 can be a lower-dimensional representation of the input 304. The decoder portion 316 can receive the encoding 315 and produce recreated input 318 as output. The recreated input 318 approximates the input 304 as predicted by the autoencoder 312. Generally, training the autoencoder 312 can improve the degree to which the recreated input 318 approximates the input 304.

Figure 3C:
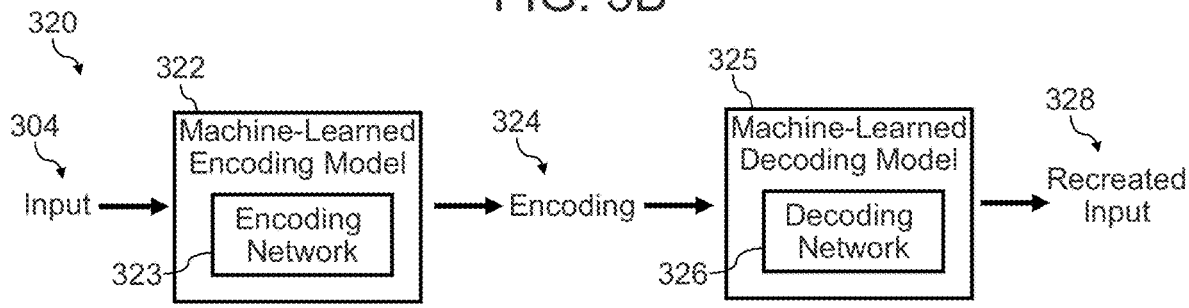

FIG. 3C depicts a machine-learned system 320 according to example aspects of the present disclosure. Machine-learned system 320 is similar to the machine-learned system 310 of FIG. 3B. However, instead of being arranged as an autoencoder, the machine-learned system 320 includes a separate machine-learned encoding model 322 including an encoding network 323 (e.g., a neural network) and a machine-learned decoding model 325 including a separate decoding network 326 (e.g., a neural network). The encoding model 322 is configured to receive input 304 and produce an encoding 324 in response to receipt of the input 304. The encoding 324 can be a lower-dimensional representation of the input 304. The decoding model 325 can receive the encoding 324 and produce a recreated input 328 to approximate the input 304. Although the encoding model 322 and the decoding model 325 are separate models, the system 320 can be trained end-to-end such that the recreated input 328 may approximate the input 304.

Figure 3D:
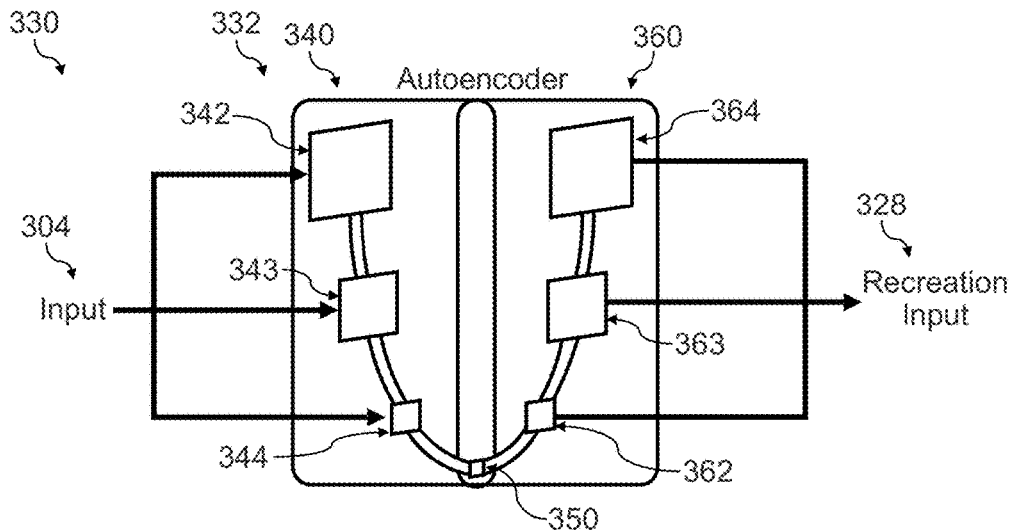

FIG. 3D depicts a machine-learned system 330 according to example aspects of the present disclosure. The system 330 includes a deep convolutional multiscale variational autoencoder (MS-VAE) 332. The MS-VAE includes an encoder portion 340 and a decoder portion 360. The encoder portion 340 is configured to receive input 304 and to produce an encoding 350 based on the input 304. The decoder portion 360 can produce recreated input 334 based on the encoding 350 that approximates the input 304.

As illustrated in FIG. 3D, the encoder portion 340 includes multiple consecutive feature sizes 342, 343, and 344. Similarly, the decoder portion 360 includes multiple consecutive feature sizes 362, 363, and 364. More or fewer feature sizes may be included in the encoder portion 340 and/or the decoder portion 360 without departing from the present disclosure. Each of the encoder portion feature sizes 342, 343, and 344 consecutively decreases from a highest resolution to an encoding resolution at which the encoding 350 is produced. Similarly, each of the decoder portion feature sizes 362, 363, and 364 consecutively increases from the encoding resolution to the input resolution. According to aspects of the present disclosure, inputs 304 may be provided directly to a respective feature size 342, 343, or 344. For instance, the residual image at the first resolution may be provided to the highest-resolution feature size 342. Alternatively, a downsampled workpiece image may be provided to a lower-resolution feature size, such as 343 or 344. In this manner, the MS-VAE 332 can take advantage of the multiple feature scales available in the input data without passing data through higher-resolution layers at which it is not effectively utilized.

Figure 4:
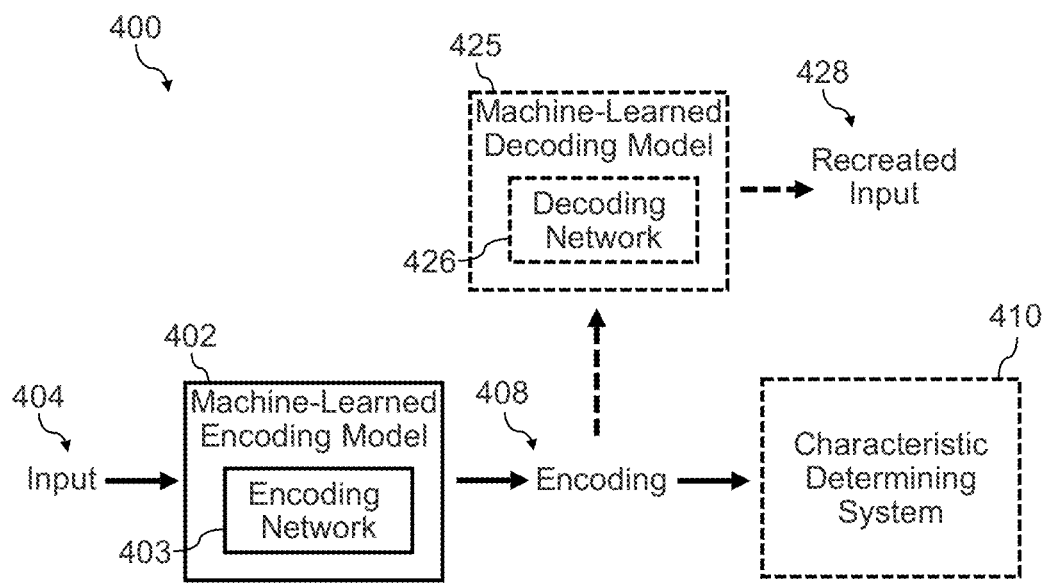
FIG. 4 depicts an example system for inspection of semiconductor workpieces according to example aspects of the present disclosure.

FIG. 4 depicts an example system 400 for inspecting and/or characterizing semiconductor workpieces according to example aspects of the present disclosure. In particular, the system 400 includes a machine-learned encoding model 402 including an encoding network 403 (e.g., a neural network) configured to produce an encoding 408 in response to receipt of input 404. Initially, the encoding model 402 can be trained end-to-end with a machine-learned decoding model 425 including a decoding network 426 (e.g., a neural network). The decoding model 425 can receive the encoding 408 and produce a recreated input 428 to approximate the input 404. Although the encoding model 402 and the decoding model 425 are separate models, they can be trained end-to-end such that the recreated input 428 may approximate the input 304. Alternatively, in some implementations, both the encoding model 402 and the decoding model 425 can be portions of an autoencoder, such as a MS-VAE.

Once the encoding model 402 and decoding model 425 are sufficiently trained such that they are able to produce a recreated input 428 from the encoding 408 that sufficiently approximates the input 404, the encoding model 402 can be used to determine characteristics of a semiconductor workpiece. In particular, the encoding 408 can be provided to a characteristic determining system 410 instead of the decoding model 425. The characteristic determining system 410 can determine one or more characteristics of a semiconductor workpiece from input 404 as described further herein. For instance, example manners of determining characteristics of a semiconductor workpiece are discussed herein with respect to FIGS. 5 and 7.

Figure 5:
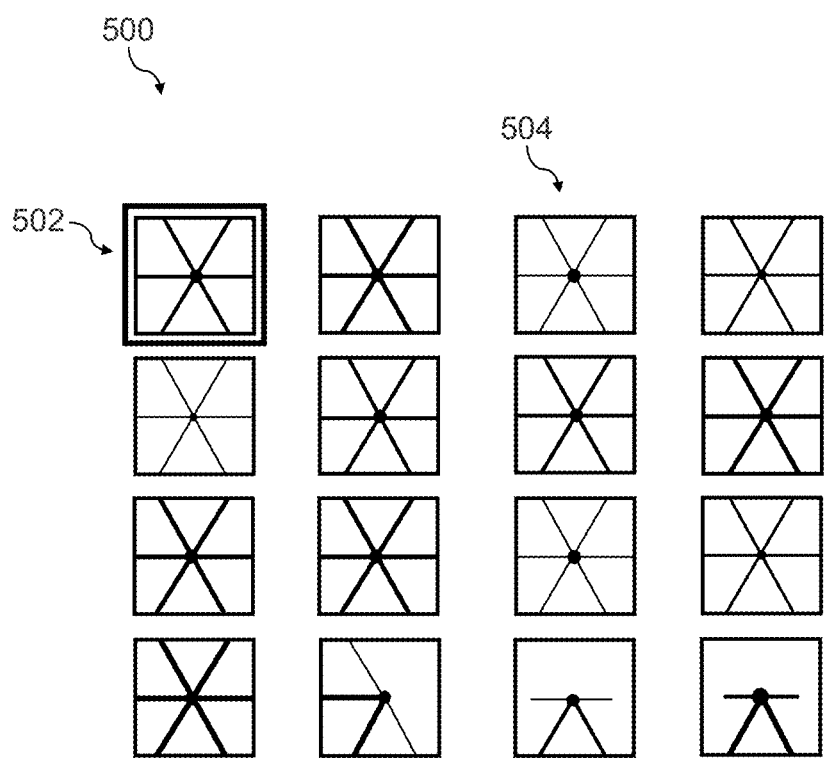
FIG. 5 depicts a set of workpiece images having a similarity characteristic according to example aspects of the present disclosure.

FIG. 5 depicts a set of workpiece images 500 having a similarity characteristic according to example aspects of the present disclosure. In particular, FIG. 5 depicts portions of workpiece images for the purposes of illustration. The workpiece image 502 is a workpiece image for which a quality characteristic (e.g., a similarity characteristic) is to be determined, as described herein. The additional workpiece images 504 depict workpieces having a similarity characteristic to the workpiece of workpiece image 502. For instance, the additional workpiece images 504 depict fifteen most similar workpieces of the set of additional semiconductor workpieces.

To determine the similarity characteristic of the workpiece corresponding to workpiece image 502, an encoding of the workpiece image 502 and residual images generated based on the workpiece image 502 can be produced as described herein. The similarity characteristics of the semiconductor workpiece corresponding to workpiece image 502 can be determined based at least in part on the encoding. In particular, this can include identifying one or more closest encodings corresponding to the one or more additional semiconductor workpieces (e.g., depicted in the workpiece images 504) to the encoding corresponding to the semiconductor workpiece (e.g., depicted in the workpiece image 502) and determining the similarity characteristic based at least in part on the one or more closest encodings. For instance, if the one or more closest encodings are within a degree of similarity of the encoding, the workpiece can have a similarity characteristic. In this example, there are fifteen closest encodings, whose respective workpieces are depicted in workpiece images 504. In some implementations, more or fewer closest encodings may be identified without departing from the scope of the present disclosure.

Figure 6A:
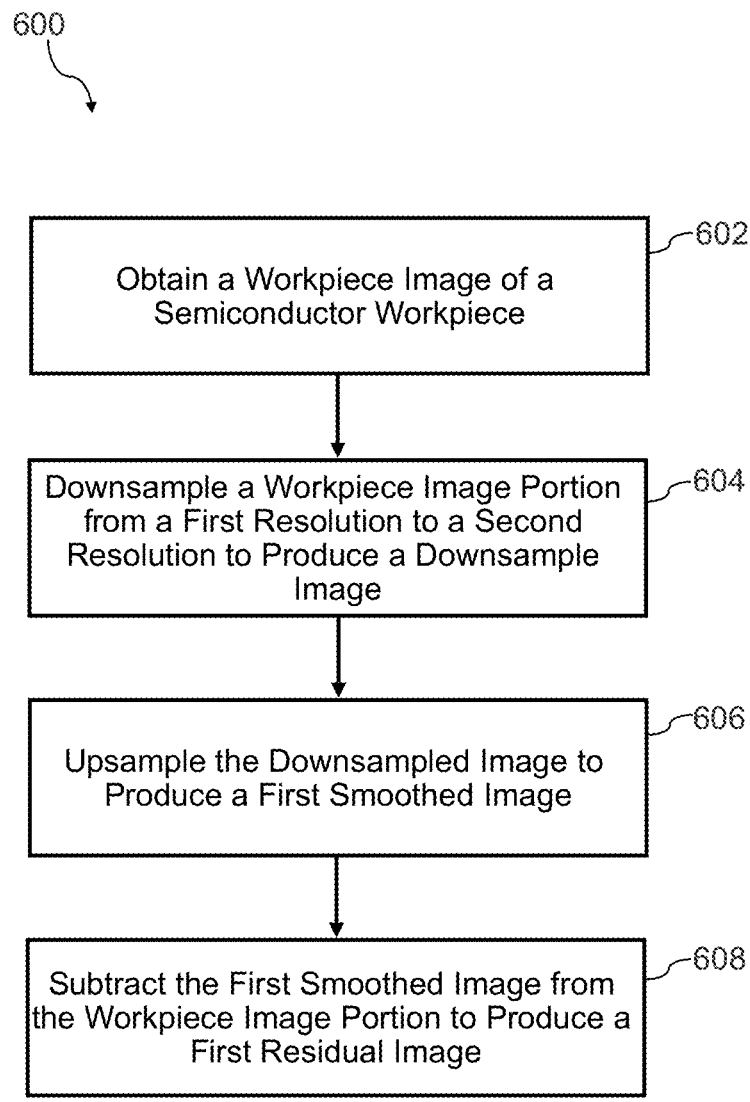
FIG. 6A depicts a flowchart diagram of an example method for inspection and/or characterization of semiconductor workpieces according to example aspects of the present disclosure.

FIG. 6A depicts a flowchart diagram of an example method 600 according to example aspects of the present disclosure. Although FIG. 6A depicts steps performed in a particular order for purposes of illustration and discussion, the methods of the present disclosure are not limited to the particularly illustrated order or arrangement. The various steps of the method 600 can be omitted, rearranged, combined, and/or adapted in various ways without deviating from the scope of the present disclosure.

The method 600 can include, at 602, The workpiece image can be captured by a suitable imaging device, such as PL microscope, x-ray topographic imaging source, cross-polarized light imaging source, camera, infrared camera, camera associated with non-visible light wavelengths, scanning electron microscope, or other suitable device configured to obtain data associated with spatial coordinates of the workpiece. As one example, the imaging device may provide workpiece images at a resolution of about 1 micron per pixel to about 10 microns per pixel. The workpiece image can span an entire surface of the semiconductor workpiece. Additionally or alternatively, the workpiece image can span a portion of the semiconductor workpiece. In some implementations, multiple smaller images depicting portions of the semiconductor workpiece can be stitched or joined together to form the workpiece image.

The method 600 can include, at 604, downsampling a workpiece image portion to produce a downsampled image. The workpiece image portion can be, for example, a crop of the workpiece image. The workpiece image portion may be cropped along one or more crop coordinates. The crop coordinates can describe the workpiece image portion relative to the entire workpiece image. For instance, the crop coordinates may include coordinates such as dimensional (e.g., X, Y) coordinates, an origin and size (e.g., length and width), or other suitable indicia of crop location. The workpiece image portion can be at a first resolution, which may be detailed enough to capture both higher-resolution features and lower-resolution features.

The workpiece image and its portion may be at the first resolution (e.g., a higher resolution) and the downsampled image can have a second resolution (e.g., a lower resolution). Any suitable resolution may be used in accordance with the present disclosure. As one example, the first resolution may be a resolution having approximately one to five microns per pixel. Additionally or alternatively, the second resolution can be some partial multiple of the first resolution, such as 0.95× the first resolution (e.g., a 5% downsample factor), or such as 0.9× the first resolution (e.g., a downsample factor), or such as 0.8× the first resolution (e.g., a 20% downsample factor), or such as 0.5× the first resolution (e.g., a 50% downsample factor), or a fixed resolution, such as approximately five to fifty microns per pixel. The downsampling can be performed by any suitable downsampling algorithm or other approach. As one example, a filter can be applied to the higher-resolution workpiece image portion to condense its contents into a lower-resolution downsampled portion. As another example, an average pooling approach, decimation approach, mipmapping approach, box sampling approach, or other suitable downsampling approach can be used, such as image resizing operations, max/min/median pooling, gaussian pyramids, custom downsampling pyramid-based methods or other approaches. The workpiece image portion and the first downsampled image may generally depict a common region of the semiconductor workpiece at different resolutions.

The method 600 can include, at 606, upsampling the downsampled image to produce a first smoothed image at the first resolution. For instance, the downsampled image can be upsampled to the first resolution to produce the first smoothed image. The first smoothed image can generally depict the same region of the semiconductor workpiece as the first downsampled image and the workpiece image portion. However, the subsequent downsampling and upsampling of the smoothed image can erase or smooth higher-resolution details, such as details that are higher resolution than the second resolution, out of the smoothed image. However, lower-resolution details, such as details that are lower resolution than the second resolution, may remain in the first smoothed image. This can include, for example, larger features, architectural features of the workpiece, or other lower-resolution features. Any suitable upsampling algorithm or other approach can be used in accordance with the present disclosure, such as, for example, various interpolation approaches (nearest neighbor, bilinear, bicubic, etc.), an artificial-intelligence-based approach (e.g., a machine-learned upsampling model), or other suitable upsampling approach.

The method 600 can include, at 608, subtracting the first smoothed image from the workpiece image portion to produce a first residual image. Any suitable approach to image subtraction can be employed in accordance with the present disclosure. For instance, if both the workpiece image portion and the first smoothed image are at the first resolution, the image subtraction may be performed as a pixel-by-pixel subtraction. The subtraction intuitively subtracts out the "average" or relatively lower-resolution features of the workpiece at the workpiece image portion, and the resulting residual image can therefore highlight higher-resolution features at the workpiece image portion. This can include higher-resolution (e.g., relatively smaller) features at a feature scale loosely bounded by the first resolution and the second resolution. Generally, the first residual image captures features at a "feature scale" approximately bounded by the first resolution and the second resolution.

Figure 6B:
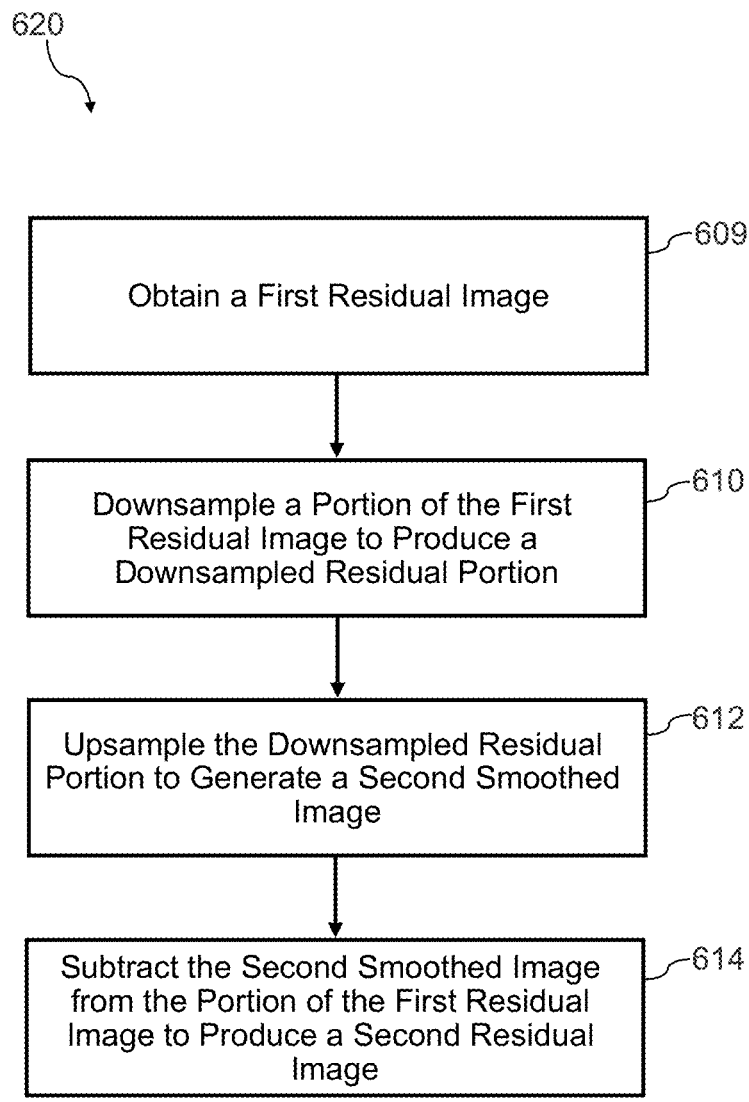
FIG. 6B depicts a flowchart diagram of an example method for inspection and/or characterization of semiconductor workpieces according to example aspects of the present disclosure.

FIG. 6B depicts a flowchart diagram of an example method 620 according to example aspects of the present disclosure. Although FIG. 6B depicts steps performed in a particular order for purposes of illustration and discussion, the methods of the present disclosure are not limited to the particularly illustrated order or arrangement. The various steps of the method 620 can be omitted, rearranged, combined, and/or adapted in various ways without deviating from the scope of the present disclosure. The steps of FIG. 6B may be performed additionally to and/or alternatively to the steps of FIG. 6A.

The method 620 can include, at 609, obtaining a first residual image. For instance, a first residual image including features at a first feature scale can be produced as described in FIG. 6A.

The method can include, at 610, downsampling a residual portion of the first residual image to produce a downsampled residual portion. The residual portion can be, for example, a crop of the first residual image. The residual portion may be cropped along one or more crop coordinates. The crop coordinates can describe the residual portion relative to the entire first residual image. For instance, the crop coordinates may include coordinates such as dimensional (e.g., X, Y) coordinates, an origin and size (e.g., length and width), or other suitable indicia of crop location. The residual portion can be at a first resolution, which may be detailed enough to capture both higher-resolution features and lower-resolution features.

The first residual image and its portion may be at the first resolution (e.g., a higher resolution). The downsampled residual portion may be downsampled to the second resolution (e.g., to capture the same length scale as the first residual image, which may provide for "focusing" the encoding model on a particular region) or to a third resolution that is different from the second resolution (e.g., to capture a different length scale from the first residual image). Any suitable resolution may be used in accordance with the present disclosure. As one example, the first resolution may be a resolution having approximately one to five microns per pixel. Additionally or alternatively, the second resolution or the third resolution can be some partial multiple of the first resolution, such as 0.95× the first resolution (e.g., a 5% downsample factor), or such as 0.9× the first resolution (e.g., a 10% downsample factor), or such as 0.8× the first resolution (e.g., a 20% downsample factor), or such as 0.5× the first resolution (e.g., a 50% downsample factor), or a fixed resolution, such as approximately five to fifty microns per pixel. The downsampling can be performed by any suitable downsampling algorithm or other approach. As one example, a filter can be applied to the higher-resolution residual portion to condense its contents into a lower-resolution downsampled portion. As another example, an average pooling approach, decimation approach, mipmapping approach, box sampling approach, or other suitable downsampling approach can be used. The residual portion and the first downsampled residual portion may generally depict a common region of the semiconductor workpiece at different resolutions.

The method 600 can include, at 612, upsampling the downsampled residual portion to produce a second smoothed image at the first resolution. For instance, the downsampled residual portion can be upsampled to the first resolution to produce the second smoothed image. The second smoothed image can generally depict the same region of the semiconductor workpiece as the first downsampled residual portion and the residual portion. However, the subsequent downsampling and upsampling of the second smoothed image can erase or smooth higher-resolution details, such as details that are higher resolution than the second resolution or third resolution, out of the smoothed image. However, lower-resolution details, such as details that are lower resolution than the second resolution or third resolution, may remain in the second smoothed image. This can include, for example, larger features, architectural features of the workpiece, or other lower-resolution features. Any suitable upsampling algorithm or other approach can be used in accordance with the present disclosure, such as, for example, various interpolation approaches (nearest neighbor, bilinear, bicubic, etc.), an artificial-intelligence-based approach (e.g., a machine-learned upsampling model), or other suitable upsampling approach.

The method 620 can include, at 614, subtracting the second smoothed image from the residual portion to produce a second residual image. Any suitable approach to image subtraction can be employed in accordance with the present disclosure. For instance, if both the residual portion and the second smoothed image are at the first resolution, the image subtraction may be performed as a pixel-by-pixel subtraction. The subtraction intuitively subtracts out the "average" or relatively lower-resolution features of the workpiece at the residual portion, and the resulting residual image can therefore highlight higher-resolution features at the residual portion. This can include higher-resolution (e.g., relatively smaller) features at a feature scale loosely bounded by the first resolution and the second resolution. Generally, the second residual image captures features at a "feature scale" approximately bounded by the first resolution and the second resolution or the second resolution and the third resolution, if the third resolution is used.

Figure 7:
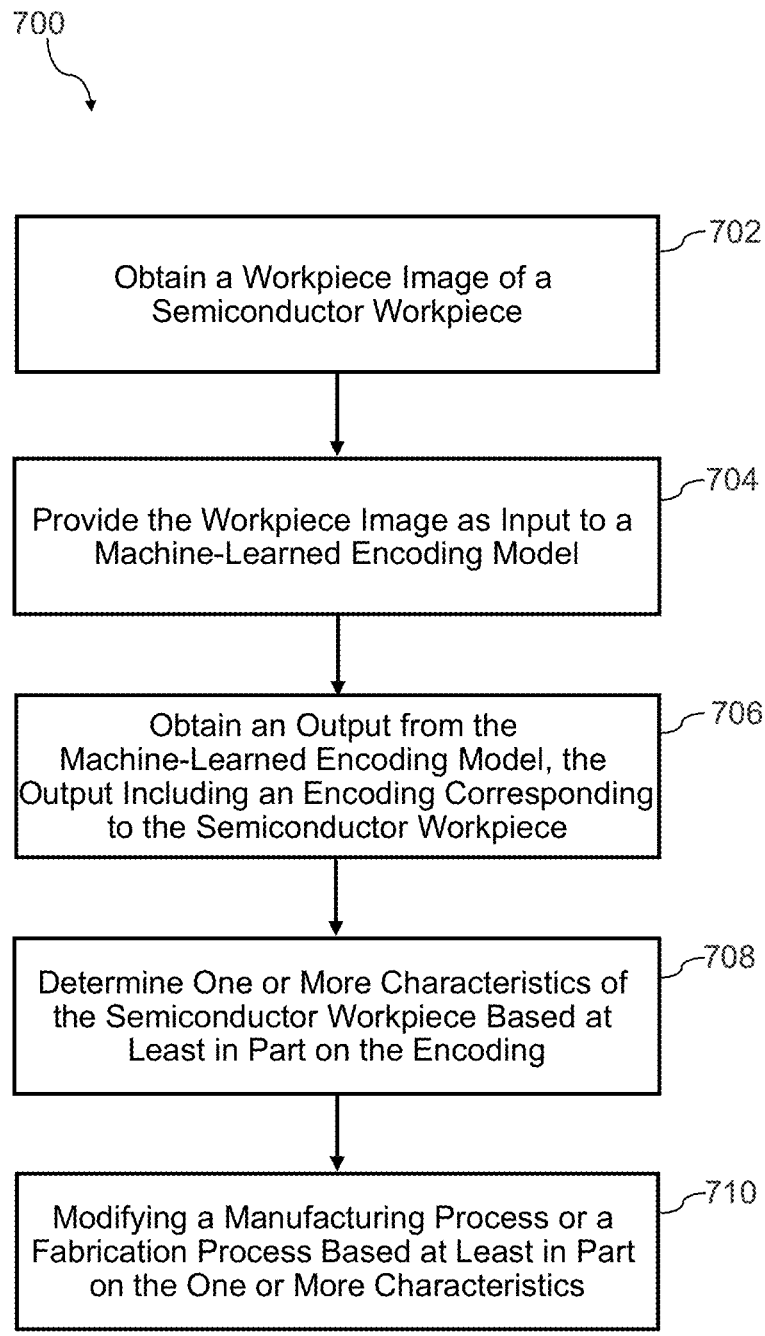
FIG. 7 depicts a flowchart diagram of an example method for inspection and/or characterization of semiconductor workpieces according to example aspects of the present disclosure.

FIG. 7 depicts a flow chart diagram of an example method 700 according to example aspects of the present disclosure. Although FIG. 7 depicts steps performed in a particular order for purposes of illustration and discussion, the methods of the present disclosure are not limited to the particularly illustrated order or arrangement. The various steps of the method 700 can be omitted, rearranged, combined, and/or adapted in various ways without deviating from the scope of the present disclosure.

The method 700 can include, at 702, obtaining a workpiece image of a semiconductor workpiece. The workpiece image can be captured by a suitable imaging device, such as a PL microscope, x-ray topographic imaging source, cross-polarized light imaging source, camera, infrared camera, camera associated with non-visible light wavelengths, scanning electron microscope, or other suitable device configured to obtain data associated with spatial coordinates of the workpiece. As one example, the imaging device may provide workpiece images at a resolution of about 1 micron per pixel to about 10 microns per pixel.). As one example, the imaging device may provide workpiece images at a resolution of about one to five microns per pixel. The workpiece image can span an entire surface of the semiconductor workpiece. Additionally or alternatively, the workpiece image can span a portion of the semiconductor workpiece. In some implementations, multiple smaller images depicting portions of the semiconductor workpiece can be stitched or joined together to form the workpiece image.

The method 700 can include, at 704, providing the workpiece image as input to a machine-learned encoding model. The machine-learned encoding model can be any suitable encoding or encoder model. An encoding model can receive various types of input (e.g., image data, alphanumerical data, etc.) and, in response to receipt of the input data, produce an encoding as output. The encoding can be a representation of the input variables in a machine-encoded format (e.g., a numerical format). Generally, the encoding may not be human-readable. However, characteristics and trends among the input data may be represented in characteristics of the encoding.

In particular, the encoding model can be trained to produce encodings that represent characteristics of the input data by training the encoding model end-to-end with a decoding or decoder model. The decoding model can be configured to receive an encoding as input and, in response to receipt of the encoding as input, produce output in a human-intelligible or other suitable format, such as image data, alphanumerical data, classification data, or other suitable data. In some implementations, such an arrangement may be referred to as an "autoencoder." However, in some implementations, the encoding model and decoding model may not necessarily be related or be part of a common model schema such as an autoencoder. For instance, the encoding model and the decoding model may be independent models having separate networks (e.g., neural networks).

Any suitable autoencoder may be used in accordance with the present disclosure. One example autoencoder that may be used is a variational autoencoder. A variational autoencoder is an artificial neural network architecture including an encoder model (or encoder network) that maps inputs to a lower-dimensional latent space that corresponds to parameters of a variational distribution. The encoding can be sampled from the latent space. The variational autoencoder can additionally include a decoder model (or decoder network) that maps from the latent space to a recreation of the input data used to populate the latent space. The variational autoencoder may include a prior and a noise distribution.

Furthermore, in some implementations, the autoencoder may be a a deep convolutional multiscale variational autoencoder (MS-VAE). The deep convolutional MS-VAE may be an autoencoder that is convolutional, e.g., that includes one or more convolutional neural networks. A convolutional neural network is a type of feed-forward neural network that applies multi-dimensional filters (or "kernels") at inputs and/or links, weighing multiple prior nodes when advancing through layers. Additionally or alternatively, the MS-VAE can receive (and/or produce) inputs at multiple scales or resolution. For instance, the MS-VAE may receive some higher-resolution inputs (e.g, a higher-resolution residual image) and some lower-resolution inputs (e.g., a down-sampled workpiece image) that are concurrently processed by the model. These inputs may be input to the model and/or generated by the model itself. For instance, the model may include one or more filters or downsampling operations to produce lower-resolution inputs from higher-resolution inputs. Alternatively, these inputs may be computed separately and provided to the model. As used herein, "providing" inputs to a machine-learned model is intended to cover these and other equivalent variations. It should be understood that the versatility of computing technology may provide for such variations to be readily ascertainable to one of ordinary skill in the art.

According to example aspects of the present disclosure, residual images at multiple length scales can be generated from a higher-resolution workpiece image of a semiconductor workpiece. These images may be provided to the encoding model (e.g., the variational autoencoder) such that the encoding model may recognize higher-resolution irregularities and features in a surface of the semiconductor workpiece. The residual images can be formed from the workpiece image (e.g., a higher-resolution workpiece image), such as from crops or portions of the workpiece image. Example methods of forming residual images are described in FIGS. 6A-6B.

In some implementations, a downsampled (e.g., lower-resolution) workpiece image can be provided as input to the machine-learned encoding model in addition to or in lieu of the full-resolution workpiece image. For instance, the method can include downsampling the workpiece image to produce a downsampled workpiece image having a lower resolution than the workpiece image and providing the downsampled workpiece image to the machine-learned encoding model. The downsampled workpiece image can be provided such that the model can reason about the entire surface of the semiconductor workpiece, but does not necessarily need to reason about the entire surface of the semiconductor workpiece at a high resolution. Rather, according to example aspects of the present disclosure, the higher-resolution details of the semiconductor workpiece can be provided to the encoding model as residual images across one or more feature scales.

Furthermore, in some implementations, additional inputs can be provided to the machine-learned encoding model. As one example, in some implementations, workpiece characterization data of the semiconductor workpiece can be provided as input to the machine-learned encoding model. The workpiece characterization data of the semiconductor workpiece can describe characteristics of the semiconductor workpiece, such as material type, polytype, doping, surface roughness, thickness, and/or other characteristics.

In some implementations, the machine-learned encoding model can include one or more batch normalization layers configured to provide at least one of a zero mean or unity variance for at least one input to the machine-learned encoding model. Additionally or alternatively, some or all of the residual image generation operations described above can be incorporated into the machine-learned encoding model (e.g., as layers of a neural network, or a separate neural network operating in parallel). These portions may be trained end-to-end with the machine-learned encoding model and/or machine-learned encoding model. In some implementations, this approach can benefit from the batch normalizations, since the approach may not normalize the input data explicitly.

The method 700 can include, at 706, obtaining an output from the machine-learned encoding model. The output can be obtained in response to the model receiving input including, for example, the workpiece image (e.g., a downsampled workpiece image), the first residual image, additional residual images, crop coordinates, and/or additional inputs. The output can be or can include an encoding corresponding to (e.g., unique to) the semiconductor workpiece. For instance, the encoding can be a lower-dimensional representation of the input data. In some implementations, the encoding may be sampled from a distribution produced by a variational autoencoder. Furthermore, in some implementations, the encoding may be an average of multiple samples from the distribution produced by a variational autoencoder.

The method 700 can include, at 708, determining one or more characteristics of the semiconductor workpiece based at least in part on the encoding. As one example, the one or more characteristics of the semiconductor workpiece can be or can include a quality characteristic of the semiconductor workpiece. For instance, the quality characteristic can generally indicate a quality score of the semiconductor workpiece, such as how well the semiconductor workpiece reflects an "ideal" workpiece.

As another example, the one or more characteristics of the semiconductor workpiece can include a similarity characteristic of the semiconductor workpiece to one or more additional semiconductor workpieces. For instance, the encoding can be compared to encodings from other semiconductor workpieces having known characteristics to determine if those characteristics are present in the semiconductor workpiece. As an example, determining the one or more characteristics of the semiconductor workpiece based at least in part on the encoding can include identifying one or more closest encodings corresponding to the one or more additional semiconductor workpieces to the encoding corresponding to the semiconductor workpiece and determining the similarity characteristic based at least in part on the one or more closest encodings. For instance, if the one or more closest encodings are within a degree of similarity of the encoding, the workpiece can have a similarity characteristic.

As another example, the one or more characteristics of the semiconductor workpiece can include an anomaly characteristics. For instance, determining the one or more characteristics of the semiconductor workpiece based at least in part on the encoding can include detecting an anomaly characteristic of the encoding corresponding to the semiconductor workpiece using an anomaly detection algorithm. Any suitable anomaly detection algorithm can be utilized in accordance with the present disclosure.

In some examples, the one or more characteristics may include classification of one or more features on the semiconductor workpiece. For instance, the encoding may be used to determine that the workpiece has one or more features, such as threading edge dislocations, basal plane dislocations, super screw dislocations, micropipes, mixed dislocations, hexagonal voids, stacking faults, scratches, other polytypes, contamination, and/or other features. For instance, certain encodings may indicate the presence of one or more micropipes. Certain encodings may indicate the presence of one or more screw dislocations. Certain encodings may indicate the present of one or more basal plane dislocations, and so forth.

In some examples, the one or more characteristics may include localized or segmented portions of image data for a labeled dataset for training other machine-learned models. The other machine-learned models may be used, for instance, to identify, localize, and/or classify features on the workpiece, such as threading edge dislocations, basal plane dislocations, super screw dislocations, micropipes, mixed dislocations, hexagonal voids, stacking faults, scratches, other polytypes, contamination, and/or other features.

In some examples, the one or more characteristics may include identification of data indicative of a distribution of features on the workpiece. For instance, the encoding may be used to determine the presence of a certain distribution of features on the workpiece, such as a distribution of one or more threading edge dislocations, basal plane dislocations, super screw dislocations, micropipes, mixed dislocations, hexagonal voids, stacking faults, scratches, other polytypes, contamination, and/or other features.

At 710, the method may include modifying a manufacturing process or a fabrication process based at least in part on the encoding (e.g., based on one or more characteristics of the workpiece determined based on the encoding). For instance, the one or more characteristics may be used to determine when to keep and/or discard certain workpieces. The characteristics may be used, for instance, to identify certain workpieces for different manufacturing operations (e.g., to address certain feature distributions associated with the encodings). The different manufacturing operations may include, for instance, grinding, lapping, polishing, or treatment process. The characteristics may be used to identify errors or other anomalies in prior manufacturing operation(s) (e.g., crystal growth, wafer separation of boules, surface processing (e.g., grinding, lapping, polishing). The prior manufacturing operation(s) may be modified to reduce future anomalies on semiconductor workpieces. The manufacturing process or the fabrication process may include a workpiece fabrication process (e.g., fabricating semiconductor workpieces, such as silicon carbide semiconductor wafers) and/or one or more stages of semiconductor device fabrication on semiconductor workpieces.

In some examples, the method may perform one or both of operations 708 or 710 depending on the particular application. For instance, in some embodiments, the method may include performing operation 708 and may determine one or more characteristics of the semiconductor workpiece based at least in part on the encoding without performing operation 710. In some embodiments, the method may include performing operation 710 that includes modifying a manufacturing process or a fabrication process based at least in part on the one or more characteristics of the workpiece determined based on the encoding without performing operation 708. In some examples, the method may include performing both operations 708 and 710.

Figure 8:
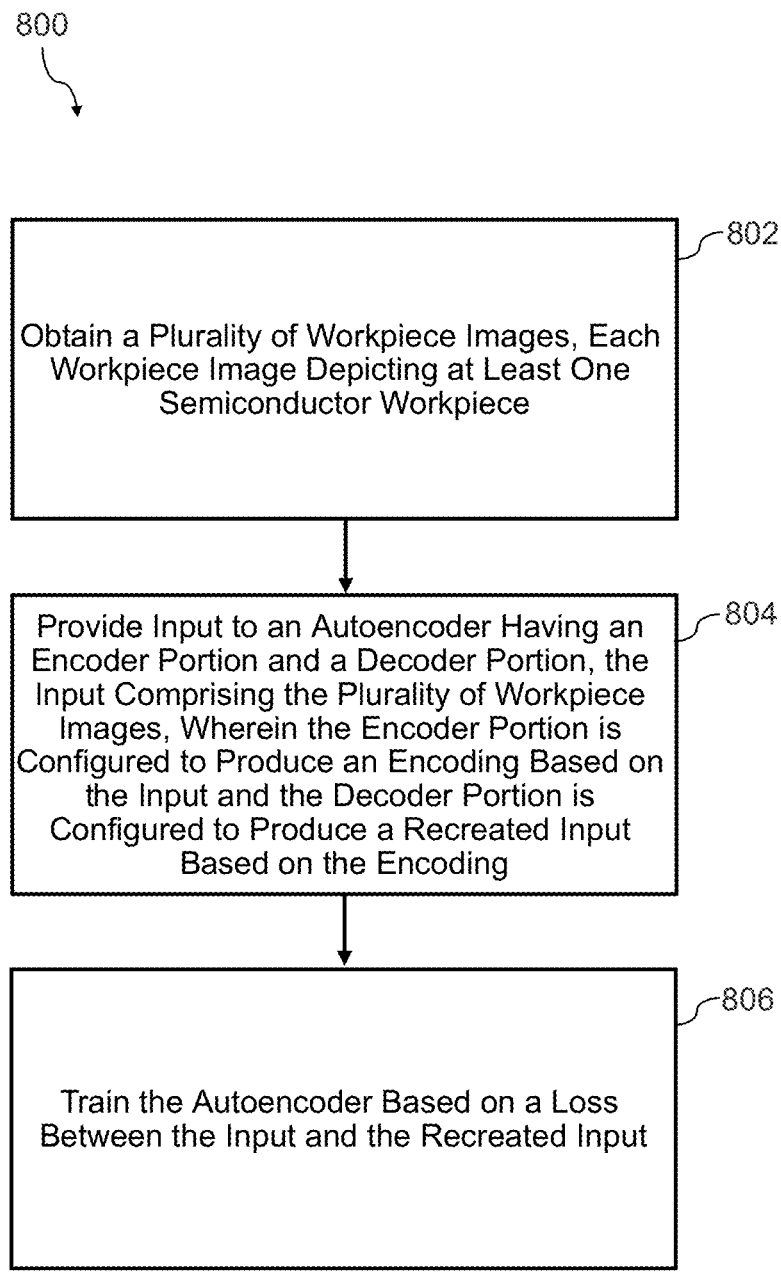
FIG. 8 depicts a flowchart diagram of an example method for training a machine-learned model for inspection and/or characterization of semiconductor workpieces according to example aspects of the present disclosure.

FIG. 8 depicts a flow chart diagram of an example method 800 for training a machine-learned model according to example aspects of the present disclosure. Although FIG. 8 depicts steps performed in a particular order for purposes of illustration and discussion, the methods of the present disclosure are not limited to the particularly illustrated order or arrangement. The various steps of the method 800 can be omitted, rearranged, combined, and/or adapted in various ways without deviating from the scope of the present disclosure.

The method 800 can include, at 802, obtaining a plurality of workpiece images. Each workpiece image can depict at least one semiconductor workpiece. The plurality of workpiece images may be obtained from a training dataset. Additionally or alternatively, the workpiece images may be captured by an imaging device, such as PL microscope, x-ray topographic imaging source, cross-polarized light imaging source, camera, infrared camera, camera associated with non-visible light wavelengths, scanning electron microscope, or other suitable device configured to obtain data associated with spatial coordinates of the workpiece.

The method 800 can include, at 804, providing input to an autoencoder having an encoder portion and a decoder portion. The input can include the plurality of workpiece images, downsampled workpiece images corresponding to the plurality of workpiece images (e.g., in lieu of the plurality of workpiece images themselves), residual images from the plurality of workpiece images produced as described above, crop coordinates, and/or additional inputs corresponding to the plurality of workpiece images. The encoder portion can be configured to produce an encoding based on the input and the decoder portion can be configured to produce a recreated input based on the encoding. The recreated input can approximate the input to the best of the autoencoder's capability, which generally improves as the autoencoder is trained on additional data.

The method 800 can include, at 806, training the autoencoder based on a loss between the input and the recreated input. The loss may be quantified by a loss function. Loss functions may be used individually or in any combination. For example, an L1 loss, L2 loss, conditional generative adversarial network (CGAN) loss, VGG loss, and/or an adversarial loss may be used in combination to evaluate the model's prediction. The evaluation may also be completed with any of the loss functions individually. In some implementations, a KL divergence loss function can aid in evaluating the training. For example, a KL divergence loss function may have a second term trend to zero. The trending towards zero may indicate an improvement in the system, and that the system is becoming closer to being optimized. The loss can define a difference between the input and recreated input, which is provided to the autoencoder. The autoencoder can adjust some or all parameters of the encoder portion and/or the decoder portion based on the loss (e.g., based on a gradient of the loss). Other suitable loss functions can be employed in accordance with example aspects of the present disclosure.

Figure 9:
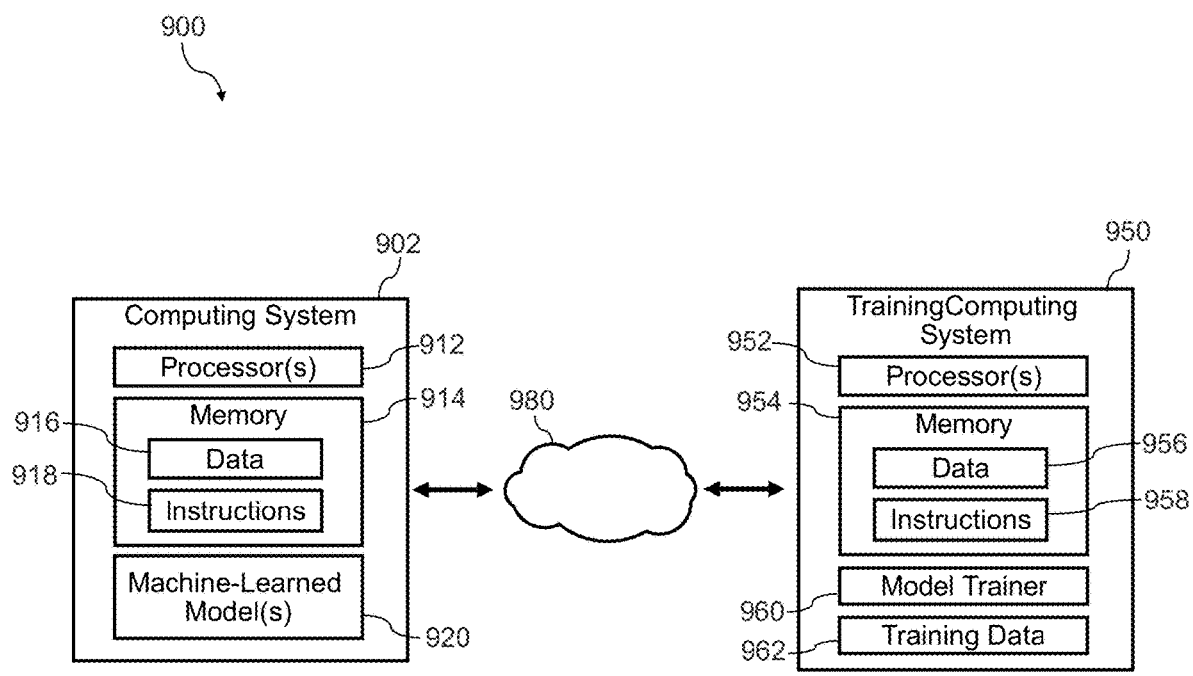
FIG. 9 depicts a block diagram of an example computing system that can be used to implement systems and methods according to example embodiments of the present disclosure.

FIG. 9 depicts a block diagram of an example computing system 900 that can be used to implement systems and methods according to example embodiments of the present disclosure. The system 900 includes a computing system 902 and a training computing system 950 that are communicatively coupled over a network 980.

The computing system 902 can include any type of computing device (e.g., classical and/or quantum computing device). The computing system 902 includes one or more processors 912 and a memory 914. The one or more processors 912 can be any suitable processing device (e.g., a processor core, a microprocessor, CPU, GPU, an ASIC, a FPGA, a controller, a microcontroller, etc.) and can be one processor or a plurality of processors that are operatively connected. The memory 914 can include one or more non-transitory computer-readable storage mediums, such as RAM, ROM, EEPROM, EPROM, flash memory devices, magnetic disks, etc., and combinations thereof. The memory 914 can store data 916 (e.g., parameters, input data, etc.) and instructions 918 which are executed by the processor 912 to cause the computing system 902 to perform operations. In some implementations, the computing system 902 can store or include one or more machine-learned models 920 (e.g., autoencoders, machine-learned encoding models, etc.) as described herein.

The computing system 902 can train the machine-learned model(s) 920 via interaction with the training computing system 950 that is communicatively coupled over the network 980. The training computing system 950 can be separate from the computing system 902 or can be a portion of the computing system 902.

The training computing system 950 includes one or more processors 952 and a memory 954. The one or more processors 952 can be any suitable processing device (e.g., a processor core, a microprocessor, CPU, GPU, an ASIC, a FPGA, a controller, a microcontroller, etc.) and can be one processor or a plurality of processors that are operatively connected. The memory 954 can include one or more non-transitory computer-readable storage mediums, such as RAM, ROM, EEPROM, EPROM, flash memory devices, magnetic disks, etc., and combinations thereof. The memory 954 can store data 956 and instructions 958 which are executed by the processor 952 to cause the training computing system 950 to perform operations. In some implementations, the training computing system 950 includes or is otherwise implemented by one or more server computing devices.

The training computing system 950 can include a model trainer 960 that trains the machine-learned model(s) 920 using various training or learning techniques, such as, for example, backwards propagation of errors. In some implementations, performing backwards propagation of errors can include performing truncated backpropagation through time. The model trainer 960 can perform a number of generalization techniques (e.g., weight decays, dropouts, etc.) to improve the generalization capability of the models being trained.

In particular, the model trainer 960 can train the machine-learned model(s) 920 based on a set of training data 962. The training data 962 can include, for example, input data corresponding to a plurality of semiconductor workpieces, such as workpiece images, downsampled workpiece images, residual images, crop coordinates, and/or additional inputs.

The model trainer 960 includes computer logic utilized to provide desired functionality. The model trainer 960 can be implemented in hardware, firmware, and/or software controlling a general purpose processor. For example, in some implementations, the model trainer 960 includes program files stored on a storage device, loaded into a memory and executed by one or more processors. In other implementations, the model trainer 960 includes one or more sets of computer-executable instructions that are stored in a tangible computer-readable storage medium such as RAM hard disk or optical or magnetic media.

The network 980 can be any type of communications network, such as a local area network (e.g., intranet), wide area network (e.g., Internet), or some combination thereof and can include any number of wired or wireless links. In general, communication over the network 980 can be carried via any type of wired and/or wireless connection, using a wide variety of communication protocols (e.g., TCP/IP, HTTP, SMTP, FTP), encodings or formats (e.g., HTML, XML), and/or protection schemes (e.g., VPN, secure HTTP, SSL).

FIG. 9 illustrates one example computing system that can be used to implement example aspects of the present disclosure. Other computing systems can be used as well. For example, in some implementations, the computing system 902 can include the model trainer 960 and the training dataset 962. In such implementations, the model(s) 920 can be both trained and used locally at the computing system 902.

Figure 10:
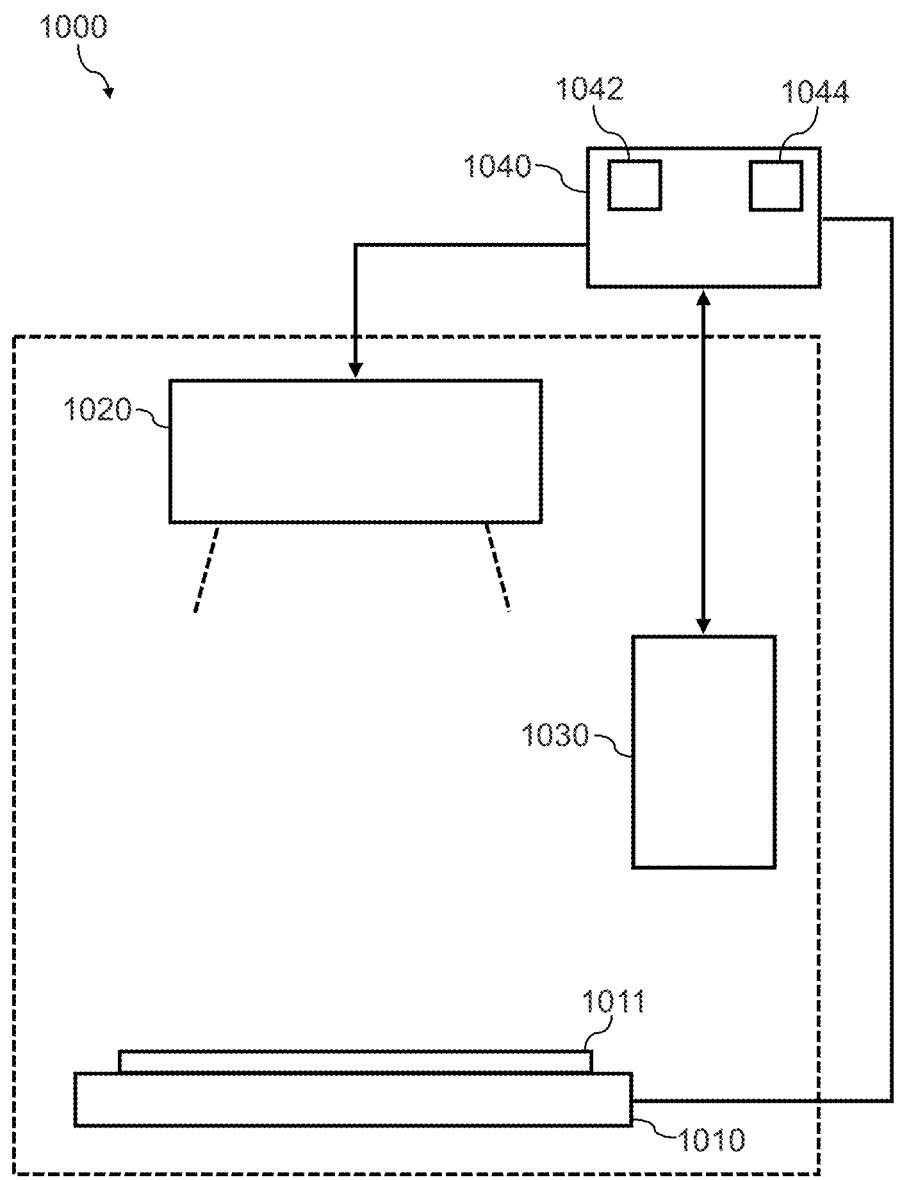
FIG. 10 depicts a block diagram of an example system that can semiconductor workpiece characterization according to example embodiments of the present disclosure.

FIG. 10 depicts an example system 1000 that can be used to implement systems and methods according to example embodiments of the present disclosure. Those of ordinary skill in the art, using the disclosures provided herein, will understand that the system 1000 may include more or fewer components without deviating from the scope of the present disclosure. The system 1000 may be configured to implement one or more aspects of the present disclosure, such as the processing operations for inspecting and/or characterizing of semicondutor workpieces described herein.

The system 1000 can include a workpiece support 1010 configured to support a semiconductor workpiece 1011. The workpiece support may include a chuck (e.g., a vacuum chuck) or other mechanism to secure the semiconductor workpiece 100 during processing by the system 1000. Additionally or alternatively, in some implementations, the workpiece support 1010 may provide a surface on which the semiconductor workpiece 1011 rests. In some implementations, the workpiece support 1010 may provide for moving, rotating, angling, or otherwise reorienting the workpiece 1011 relative to the system 1000. In some examples, the system 1000 may include a workpiece handling robot operable to move the workpiece to the workpiece support 1010.

The system 1000 can include one or more imaging devices 1020. The imaging device(s) 1020 can obtain workpiece images from the surface of the workpiece 1011. The workpiece images may have a resolution, which may be dependent in part on a resolution of the imaging device(s) 1020. As one example, the resolution may have approximately 1 microns per pixel to about 10 microns per pixel. However, in some examples, the resolution may be less than 1 micron per pixel. The imaging device(s) 1020 may include any suitable imaging device, such as a PL microscope, x-ray topographic imaging source, cross-polarized light imaging source, camera, infrared camera, camera associated with non-visible light wavelengths, scanning electron microscope, or other suitable device configured to obtain data associated with spatial coordinates of the workpiece.

In some embodiments, the system 1000 may additionally include one or more sensors 1030 for obtaining data associated with the semiconductor workpiece 1011, such as workpiece characterization data for the semiconductor workpiece 1011. Workpiece characterization data is data that provides information associated with the semiconductor workpiece 110, such as topography, roughness, presence of anomalies, doping, thickness, and/or other characteristics. Workpiece characterization data may include, for instance, an image of the surface of the workpiece 1011 and/or a topological map of the surface of the workpiece 1011. In some embodiments, the one or more sensors 1030 may include one or more surface measurement lasers that may be operable to emit a laser onto the surface of the workpiece 1011 and scan the surface (based on reflections of the laser) for depth measurements, topography measurements, etc. of the surface of the workpiece 1011. Other suitable sensors may be used without deviating from the scope of the present disclosure.

The system 1000 includes one or more control devices, such as a controller 1040. The controller 1040 may include one or more processors 1042 and one or more memory devices 1044. The one or more memory devices 1044 may store computer-readable instructions that when executed by the one or more processors 1042 cause the one or more processors 1042 to perform one or more control functions, such as any of the functions described herein. The controller 1040 may be in communication with various other aspects of the system 1000 through one or more wired and/or wireless control links. The controller 1040 may send control signals to the various components of the system 1000 (e.g., the the workpiece support 1010, the imaging device(s) 1020, the sensor(s) 1030, etc.) to implement the aspects of the present disclosure described herein. Additionally, the controller 1040 may include one or more machine-learned models (e.g., a machine-learned encoding model, autoencoder, etc.) for inspecting and/or characterizing of semiconductor workpieces, as described herein. As one example, the controller 1040 may be at least a portion of the computing system 900 of FIG. 9 (e.g., the computing system 902 and/or the training computing system 950).

The technology discussed herein makes reference to servers, databases, software applications, and other computer-based systems, as well as actions taken and information sent to and from such systems. The inherent flexibility of computer-based systems allows for a great variety of possible configurations, combinations, and divisions of tasks and functionality between and among components. For instance, processes discussed herein can be implemented using a single device or component or multiple devices or components working in combination. Databases and applications can be implemented on a single system or distributed across multiple systems. Distributed components can operate sequentially or in parallel.

Example aspects of the present disclosure are set forth below. Any of the below features or examples may be used in combination with any of the embodiments or features provided in the present disclosure.

In an aspect, the present disclosure provides an example method. In some implementations, the example method includes obtaining a workpiece image of a semiconductor workpiece. In some implementations, the example method includes providing the workpiece image as input to a machine-learned encoding model. In some implementations, the example method includes obtaining an output from the machine-learned encoding model, the output comprising an encoding corresponding to the semiconductor workpiece. In some implementations, the example method includes determining one or more characteristics of the semiconductor workpiece based at least in part on the encoding.

In some implementations, the example method includes downsampling a workpiece image portion of the workpiece image from a first resolution to a second resolution to produce a downsampled image. In some implementations, the example method includes upsampling the downsampled image to the first resolution to produce a first smoothed image at the first resolution. In some implementations, the example method includes subtracting the first smoothed image from the workpiece image portion to produce a first residual image.

In some implementations of the example method, the method further includes providing the first residual image to the machine-learned encoding model.

In some implementations of the example method, the workpiece image portion includes a crop of the workpiece image according to one or more crop coordinates. In some implementations of the example method, the method further includes providing the crop coordinates of the crop of the workpiece image to the machine-learned encoding model.

In some implementations of the example method, the first smoothed image includes lower-resolution features and the first residual image includes higher-resolution features.

In some implementations, the example method includes downsampling a residual portion of the first residual image to produce a downsampled residual portion. In some implementations, the example method includes upsampling the downsampled residual portion to produce a second smoothed image. In some implementations, the example method includes subtracting the second smoothed image from the residual portion of the first residual image to produce a second residual image.

In some implementations, the example method further includes providing the second residual image to the machine-learned encoding model.

In some implementations of the example method, the second residual image corresponds to a smaller portion of the semiconductor workpiece than the first residual image.

In some implementations, the example method includes downsampling the workpiece image to produce a downsampled workpiece image having a lower resolution than the workpiece image. In some implementations, the example method includes providing the downsampled workpiece image to the machine-learned encoding model.

In some implementations of the example method, the machine-learned encoding model includes an encoder portion of an autoencoder.

In some implementations of the example method, the autoencoder includes a decoder portion.

In some implementations of the example method, the encoder portion of the autoencoder is trained end-to-end with the decoder portion of the autoencoder to encode and decode at least workpiece images.

In some implementations of the example method, the autoencoder includes a variational autoencoder.

In some implementations of the example method, the variational autoencoder includes a deep convolutional multiscale variational autoencoder (MS-VAE).

In some implementations of the example method, the machine-learned encoding model is trained end-to-end with a machine-learned decoding model comprising a separate neural network from the machine-learned encoding model.

In some implementations of the example method, the machine-learned encoding model includes one or more batch normalization layers configured to provide at least one of a zero mean or unity variance for at least one input to the machine-learned encoding model.

In some implementations, the example method further includes providing workpiece characterization data of the semiconductor workpiece as input to the machine-learned encoding model.

In some implementations of the example method, the one or more characteristics of the semiconductor workpiece includes a quality characteristic of the semiconductor workpiece.

In some implementations of the example method, the one or more characteristics of the semiconductor workpiece includes an anomaly characteristic.

In some implementations of the example method, determining the one or more characteristics of the semiconductor workpiece based at least in part on the encoding includes detecting the anomaly characteristic based at least in part on the encoding corresponding to the semiconductor workpiece.

In some implementations of the example method, the one or more characteristics of the semiconductor workpiece includes a similarity characteristic of the semiconductor workpiece to one or more additional semiconductor workpieces.

In some implementations of the example method, determining the one or more characteristics of the semiconductor workpiece based at least in part on the encoding includes identifying one or more closest encodings corresponding to the one or more additional semiconductor workpieces to the encoding corresponding to the semiconductor workpiece. In some implementations of the example method, determining the one or more characteristics of the semiconductor workpiece based at least in part on the encoding includes determining the similarity characteristic based at least in part on the one or more closest encodings.

In an aspect, the present disclosure provides an example method. In some implementations, the example method includes obtaining a plurality of workpiece images, each workpiece image depicting at least one semiconductor workpiece. In some implementations, the example method includes providing input to an autoencoder having an encoder portion and a decoder portion, the input comprising the plurality of workpiece images, wherein the encoder portion is configured to produce an encoding based on the input and the decoder portion is configured to produce a recreated input based on the encoding. In some implementations, the example method includes training the autoencoder based on a loss between the input and the recreated input.

In some implementations of the example method, the method further includes, for each workpiece image of the plurality of workpiece images, downsampling a workpiece image portion from a first resolution to a second resolution to produce a downsampled image. In some implementations of the example method, the method further includes, for each workpiece image of the plurality of workpiece images, upsampling the downsampled image to the first resolution to produce a first smoothed image. In some implementations of the example method, the method further includes, for each workpiece image of the plurality of workpiece images, subtracting the first smoothed image from the workpiece image portion to produce a first residual image.

In some implementations of the example method, the input includes the first residual image for each workpiece image of the plurality of workpiece images.

In some implementations of the example method, the workpiece image portion includes a crop of the workpiece image according to one or more crop coordinates. In some implementations of the example method, the input further includes the crop coordinates of the crop of the workpiece image for each workpiece image of the plurality of workpiece images.

In some implementations of the example method, the first smoothed image includes lower-resolution features and the first residual image includes higher-resolution features.

In some implementations, the example method includes downsampling a residual portion of the first residual image to produce a downsampled residual portion. In some implementations, the example method includes upsampling the downsampled residual portion to produce a second smoothed image. In some implementations, the example method includes subtracting the second smoothed image from the residual portion of the first residual image to produce a second residual image.

In some implementations of the example method, the input includes the second residual image for each workpiece image of the plurality of workpiece images.

In some implementations of the example method, the second residual image corresponds to a smaller portion of the semiconductor workpiece than the first residual image.

In some implementations, the example method includes downsampling at least one workpiece image of the plurality of workpiece images to produce a downsampled workpiece image having a lower resolution than the at least one workpiece image. In some implementations, the input includes the downsampled workpiece image.

In some implementations of the example method, the autoencoder includes a variational autoencoder.

In some implementations of the example method, the variational autoencoder includes a deep convolutional multiscale variational autoencoder (MS-VAE).

In some implementations of the example method, the autoencoder includes one or more batch normalization layers configured to provide at least one of a zero mean or unity variance for the input.

In some implementations of the example method, the input includes workpiece characterization data of the at least one semiconductor workpiece of some or all of the plurality of workpiece images.

In some implementations of the example method, the loss includes at least one of an L1 loss, an L2 loss, or a conditional generative adversarial network loss.

In an aspect, the present disclosure provides an example method. In some implementations, the example method includes obtaining a workpiece image of a semiconductor workpiece. In some implementations, the example method includes downsampling a workpiece image portion from a first resolution to a second resolution to produce a downsampled image. In some implementations, the example method includes upsampling the downsampled image to produce a first smoothed image. In some implementations, the example method includes subtracting the first smoothed image from the workpiece image portion to produce a first residual image.

In some implementations of the example method, the downsampled image is upsampled to the first resolution.

In some implementations of the example method, the first smoothed image includes lower-resolution features and the first residual image includes higher-resolution features.

In some implementations, the example method includes downsampling a residual portion of the first residual image to produce a downsampled residual portion. In some implementations, the example method includes upsampling the downsampled residual portion to generate a second smoothed image. In some implementations, the example method includes subtracting the second smoothed image from the residual portion of the first residual image to produce a second residual image.

In some implementations of the example method, the residual portion of the first residual image is downsampled to the second resolution.

In some implementations of the example method, the residual portion of the first residual image is downsampled to a third resolution less than the second resolution and less than the first resolution.

In some implementations of the example method, the second residual image corresponds to a smaller portion of the semiconductor workpiece than the first residual image.

In an aspect, the present disclosure provides an example system. In some implementations, the example system includes an imaging device configured to capture a workpiece image of the semiconductor workpiece. In some implementations, the example system includes one or more processors In some implementations of the example system, the instructions further comprise downsampling a workpiece image portion of the workpiece image from a first resolution to a second resolution to produce a downsampled image. In some implementations of the example system, the instructions further comprise upsampling the downsampled image to the first resolution to produce a first smoothed image at the first resolution. In some implementations of the example system, the instructions further comprise subtracting the first smoothed image from the workpiece image portion to produce a first residual image.

In some implementations of the example system, the instructions further comprise providing the first residual image to the machine-learned encoding model.

In some implementations of the example system, the workpiece image portion includes a crop of the workpiece image according to one or more crop coordinates. In some implementations of the example system, the crop coordinates of the crop of the workpiece image are provided as input to the machine-learned encoding model.

In some implementations of the example system, the first smoothed image includes lower-resolution features and the first residual image includes higher-resolution features.

In some implementations of the example system, the instructions further comprise downsampling a residual portion of the first residual image to produce a downsampled residual portion. In some implementations of the example system, the instructions further comprise upsampling the downsampled residual portion to produce a second smoothed image. In some implementations of the example system, the instructions further comprise subtracting the second smoothed image from the residual portion of the first residual image to produce a second residual image.

In some implementations of the example system, the instructions further comprise providing the second residual image to the machine-learned encoding model.

In some implementations of the example system, the second residual image corresponds to a smaller portion of the semiconductor workpiece than the first residual image.

In some implementations of the example system, the instructions further comprise downsampling the workpiece image to produce a downsampled workpiece image having a lower resolution than the workpiece image. In some implementations of the example system, the instructions further comprise providing the downsampled workpiece image to the machine-learned encoding model.

In some implementations of the example system, the machine-learned encoding model includes an encoder portion of an autoencoder.

In some implementations of the example system, the autoencoder includes a decoder portion.

In some implementations of the example system, the encoder portion of the autoencoder is trained end-to-end with the decoder portion of the autoencoder to encode and decode at least workpiece images.

In some implementations of the example system, the autoencoder includes a variational autoencoder.

In some implementations of the example system, the variational autoencoder includes a deep convolutional multiscale variational autoencoder (MS-VAE).

In some implementations of the example system, the machine-learned encoding model is trained end-to-end with a machine-learned decoding model comprising a separate neural network from the machine-learned encoding model.

In some implementations of the example system, the machine-learned encoding model includes one or more batch normalization layers configured to provide at least one of a zero mean or unity variance for at least one input to the machine-learned encoding model.

In some example implementations, the system includes instructions for providing workpiece characterization data of the semiconductor workpiece as input to the machine-learned encoding model.

In some implementations of the example system, the one or more characteristics of the semiconductor workpiece includes a quality characteristic of the semiconductor workpiece.

In some implementations of the example system, the one or more characteristics of the semiconductor workpiece includes an anomaly characteristic.

In some implementations of the example system, determining the one or more characteristics of the semiconductor workpiece based at least in part on the encoding includes detecting the anomaly characteristic of the encoding corresponding to the semiconductor workpiece using an anomaly detection algorithm.

In some implementations of the example system, the one or more characteristics of the semiconductor workpiece includes a similarity characteristic of the semiconductor workpiece to one or more additional semiconductor workpieces.

In some implementations of the example system, determining the one or more characteristics of the semiconductor workpiece based at least in part on the encoding includes identifying one or more closest encodings corresponding to the one or more additional semiconductor workpieces to the encoding corresponding to the semiconductor workpiece. In some implementations of the example system, determining the one or more characteristics of the semiconductor workpiece based at least in part on the encoding includes determining the similarity characteristic based at least in part on the one or more closest encodings.

In an aspect, the present disclosure provides an example method. In some implementations, the example method includes obtaining a workpiece image of a semiconductor workpiece. In some implementations, the example method includes providing the workpiece image as input to a machine-learned encoding model. In some implementations, the example method includes obtaining an output from the machine-learned encoding model, the output comprising an encoding corresponding to the semiconductor workpiece. In some implementations, the example method includes modifying a manufacturing process based at least in part on the encoding.

In some implementations, the example method includes downsampling a workpiece image portion of the workpiece image from a first resolution to a second resolution to produce a downsampled image. In some implementations, the example method includes upsampling the downsampled image to the first resolution to produce a first smoothed image at the first resolution. In some implementations, the example method includes subtracting the first smoothed image from the workpiece image portion to produce a first residual image.

In some implementations, the method further includes providing the first residual image to the machine-learned encoding model.

In some implementations of the example method, the workpiece image portion includes a crop of the workpiece image according to one or more crop coordinates. In some implementations of the example method, the method further includes providing the crop coordinates of the crop of the workpiece image to the machine-learned encoding model.

In some implementations of the example method, the first smoothed image includes lower-resolution features and the first residual image includes higher-resolution features.

In some implementations, the example method includes downsampling a residual portion of the first residual image to produce a downsampled residual portion. In some implementations, the example method includes upsampling the downsampled residual portion to produce a second smoothed image. In some implementations, the example method includes subtracting the second smoothed image from the residual portion of the first residual image to produce a second residual image.

In some implementations, the method further includes providing the second residual image to the machine-learned encoding model.

In some implementations of the example method, the second residual image corresponds to a smaller portion of the semiconductor workpiece than the first residual image.

In some implementations, the example method includes downsampling the workpiece image to produce a downsampled workpiece image having a lower resolution than the workpiece image. In some implementations, the example method includes providing the downsampled workpiece image to the machine-learned encoding model.

In some implementations of the example method, the machine-learned encoding model includes an encoder portion of an autoencoder.

In some implementations of the example method, the autoencoder includes a decoder portion.

In some implementations of the example method, the encoder portion of the autoencoder is trained end-to-end with the decoder portion of the autoencoder to encode and decode at least workpiece images.

In some implementations of the example method, the autoencoder includes a variational autoencoder.

In some implementations of the example method, the variational autoencoder includes a deep convolutional multiscale variational autoencoder (MS-VAE).

In some implementations of the example method, the machine-learned encoding model is trained end-to-end with a machine-learned decoding model comprising a separate neural network from the machine-learned encoding model.

In some implementations of the example method, the machine-learned encoding model includes one or more batch normalization layers configured to provide at least one of a zero mean or unity variance for at least one input to the machine-learned encoding model.

In some implementations, the method further includes providing workpiece characterization data of the semiconductor workpiece as input to the machine-learned encoding model.

In some implementations of the example method, modifying a manufacturing process includes determining whether to discard the workpiece.

In some implementations of the example method, modifying a manufacturing process includes identifying the workpiece for a different manufacturing operation to address a feature associated with the encoding.

In some implementations of the example method, modifying a manufacturing process includes modifying a prior manufacturing operation to reduce future anomalies.

While the present subject matter has been described in detail with respect to various specific example embodiments thereof, each example is provided by way of explanation, not limitation of the disclosure. Those skilled in the art, upon attaining an understanding of the foregoing, can readily produce alterations to, variations of, and equivalents to such embodiments. Accordingly, the subject disclosure does not preclude inclusion of such modifications, variations and/or additions to the present subject matter as would be readily apparent to one of ordinary skill in the art. For instance, features illustrated or described as part of one embodiment can be used with another embodiment to yield a still further embodiment. Thus, it is intended that the present disclosure cover such alterations, variations, and equivalents.

What is claimed is:

1. A method for inspecting semiconductor workpieces, the method comprising:
   obtaining a workpiece image of a semiconductor workpiece;
   providing the workpiece image as input to a machine-learned encoding model;
   obtaining an output from the machine-learned encoding model, the output comprising an encoding corresponding to the semiconductor workpiece; and
   determining one or more characteristics of the semiconductor workpiece based at least in part on the encoding, the one or more characteristics associated with a crystalline material feature; and
   modifying a semiconductor manufacturing process based at least in part on the encoding.

2. The method of claim 1, further comprising:
   downsampling a workpiece image portion of the workpiece image from a first resolution to a second resolution to produce a downsampled image;
   upsampling the downsampled image to the first resolution to produce a first smoothed image at the first resolution; and
   subtracting the first smoothed image from the workpiece image portion to produce a first residual image.

3. The method of claim 2, further comprising providing the first residual image to the machine-learned encoding model.

4. The method of claim 2, wherein:
   the workpiece image portion comprises a crop of the workpiece image according to one or more crop coordinates; and
   the method further comprises providing the crop coordinates of the crop of the workpiece image to the machine-learned encoding model.

5. The method of claim 2, wherein the first smoothed image comprises lower-resolution features and the first residual image comprises higher-resolution features.

6. The method of claim 2, further comprising:
   downsampling a residual portion of the first residual image to produce a downsampled residual portion;
   upsampling the downsampled residual portion to produce a second smoothed image; and
   subtracting the second smoothed image from the residual portion of the first residual image to produce a second residual image.

7. The method of claim 6, further comprising providing the second residual image to the machine-learned encoding model.

8. The method of claim 6, wherein the second residual image corresponds to a smaller portion of the semiconductor workpiece than the first residual image.

9. The method of claim 1, further comprising:
   downsampling the workpiece image to produce a downsampled workpiece image having a lower resolution than the workpiece image; and
   providing the downsampled workpiece image to the machine-learned encoding model.

10. The method of claim 1, wherein the machine-learned encoding model comprises an encoder portion of an autoencoder.

11. The method of claim 1, further comprising providing workpiece characterization data of the semiconductor workpiece as input to the machine-learned encoding model.

12. The method of claim 1, wherein the one or more characteristics of the semiconductor workpiece comprises a quality characteristic of the semiconductor workpiece.

13. The method of claim 1, wherein the one or more characteristics of the semiconductor workpiece comprises an anomaly characteristic.

14. The method of claim 13, wherein determining the one or more characteristics of the semiconductor workpiece based at least in part on the encoding comprises detecting the anomaly characteristic based at least in part on the encoding corresponding to the semiconductor workpiece.

15. The method of claim 1, wherein the one or more characteristics of the semiconductor workpiece comprises a similarity characteristic of the semiconductor workpiece to one or more additional semiconductor workpieces.

16. The method of claim 15, wherein determining the one or more characteristics of the semiconductor workpiece based at least in part on the encoding comprises:
   identifying one or more closest encodings corresponding to the one or more additional semiconductor workpieces to the encoding corresponding to the semiconductor workpiece; and
   determining the similarity characteristic based at least in part on the one or more closest encodings.

17. The method of claim 1, wherein the semiconductor workpiece comprises a silicon carbide crystalline material.

18. A method for inspecting semiconductor workpieces, the method comprising:
   obtaining a workpiece image of a semiconductor workpiece;
   providing the workpiece image as input to a machine-learned encoding model;
   obtaining an output from the machine-learned encoding model, the output comprising an encoding corresponding to the semiconductor workpiece;

identifying one or more features on the semiconductor workpiece based at least in part on the encoding, the one or more features comprising one or more crystalline material features; and modifying a semiconductor manufacturing process based at least in part on the encoding.

19. The method of claim 18, further comprising:

downsampling a workpiece image portion of the workpiece image from a first resolution to a second resolution to produce a downsampled image;

upsampling the downsampled image to the first resolution to produce a first smoothed image at the first resolution; and subtracting the first smoothed image from the workpiece image portion to produce a first residual image.

20. The method of claim 18, wherein the machine-learned encoding model comprises an encoder portion of an auto-encoder.

21. The method of claim 18, wherein the semiconductor workpiece comprises a silicon carbide crystalline material.

* * * * *